(12) United States Patent
Chiu et al.

(10) Patent No.: US 12,520,554 B2
(45) Date of Patent: Jan. 6, 2026

(54) AREA-SELECTIVE REMOVAL AND SELECTIVE METAL CAP

(71) Applicant: Taiwan Semiconductor Manufacturing Company, Ltd., Hsinchu (TW)

(72) Inventors: Shih-Hang Chiu, Taichung (TW); Jui-Yang Wu, Taichung (TW); Kuan-Ting Liu, Hsinchu (TW); Weng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 426 days.

(21) Appl. No.: 18/153,597

(22) Filed: Jan. 12, 2023

(65) Prior Publication Data

US 2024/0097005 A1   Mar. 21, 2024

Related U.S. Application Data

(60) Provisional application No. 63/375,930, filed on Sep. 16, 2022.

(51) Int. Cl.
*H10D 64/01*     (2025.01)
*H01L 21/28*     (2006.01)
*H10D 64/66*     (2025.01)

(52) U.S. Cl.
CPC ..... *H10D 64/017* (2025.01); *H01L 21/28088* (2013.01); *H01L 21/28194* (2013.01); *H10D 64/667* (2025.01)

(58) Field of Classification Search
CPC .............. H10D 64/017; H10D 64/667; H10D 30/6757; H10D 30/797; H10D 30/014; H10D 30/43; H10D 30/6735; H10D 62/82; H10D 62/822; H10D 62/121; H10D 64/665–669; H10D 30/0215;
(Continued)

(56) References Cited

U.S. PATENT DOCUMENTS

2020/0058508 A1*   2/2020  Yu ........................ H10D 84/038
2022/0123124 A1*   4/2022  Chiu ................. H01L 21/02603

FOREIGN PATENT DOCUMENTS

CN          114078845 A    2/2022

* cited by examiner

*Primary Examiner* — Shahed Ahmed
(74) *Attorney, Agent, or Firm* — Ingrassia Fisher & Lorenz, LLP

(57) ABSTRACT

Disclosed is a semiconductor device and semiconductor fabrication method. A semiconductor device includes: a gate structure over a semiconductor substrate, having a high-k dielectric layer, a p-type work function layer, an n-type work function layer, a dielectric anti-reaction layer, and a glue layer; and a continuous metal cap over the gate structure formed by metal material being deposited over the gate structure, a portion of the anti-reaction layer being selectively removed, and additional metal material being deposited over the gate structure. A semiconductor fabrication method includes: receiving a gate structure; flattening the top layer of the gate structure; precleaning and pretreating the surface of the gate structure; depositing metal material over the gate structure to form a discontinuous metal cap; selectively removing a portion of the anti-reaction layer; depositing additional metal material over the gate structure to create a continuous metal cap; and containing growth of the metal cap.

20 Claims, 26 Drawing Sheets

(58) Field of Classification Search
CPC ......... H01L 21/28194; H01L 21/76897; H01L 21/32051–32053; H01L 21/28079–28088; H01L 21/28097; H01L 21/7685–76852; B82Y 10/00

See application file for complete search history.

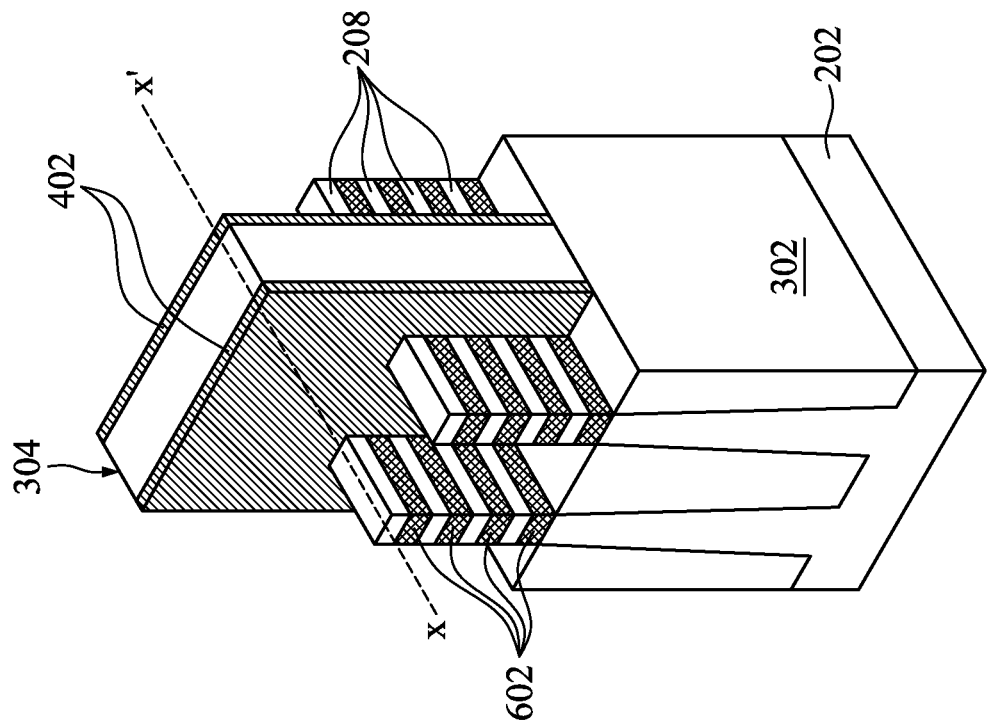
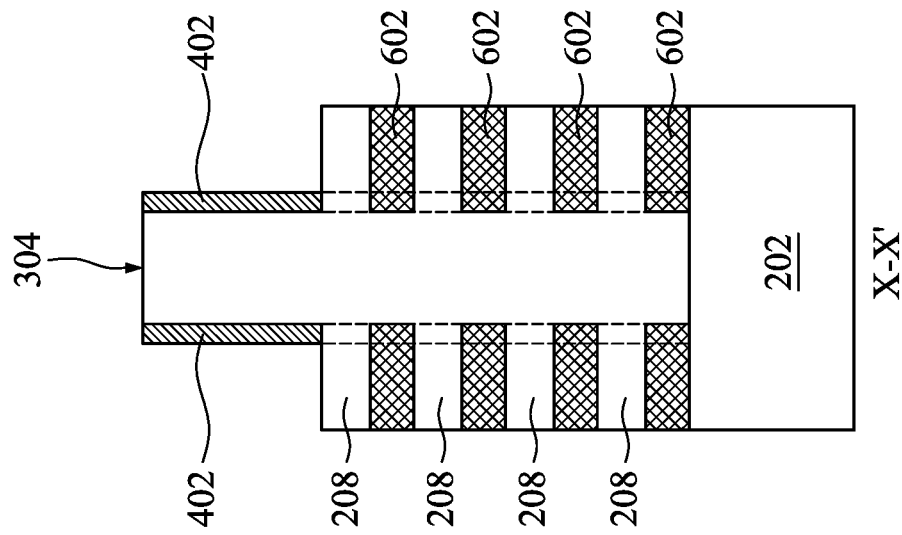
FIG. 6A
FIG. 6B

AREA-SELECTIVE REMOVAL AND SELECTIVE METAL CAP

CROSS-REFERENCE TO RELATED APPLICATIONS

This application claims the benefit of U.S. Provisional Application No. 63/375,930, filed Sep. 16, 2022.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A and 10A, are isometric views of an example semiconductor device, in accordance with some embodiments.

FIGS. 2B, 3B, 4B, 5B, 6B, 7B, 8B, 9B and 10B are corresponding cross-sectional side views of an embodiment of the example semiconductor device along a first cut X-X', in accordance with some embodiments.

DETAILED DESCRIPTION

Figure 1:
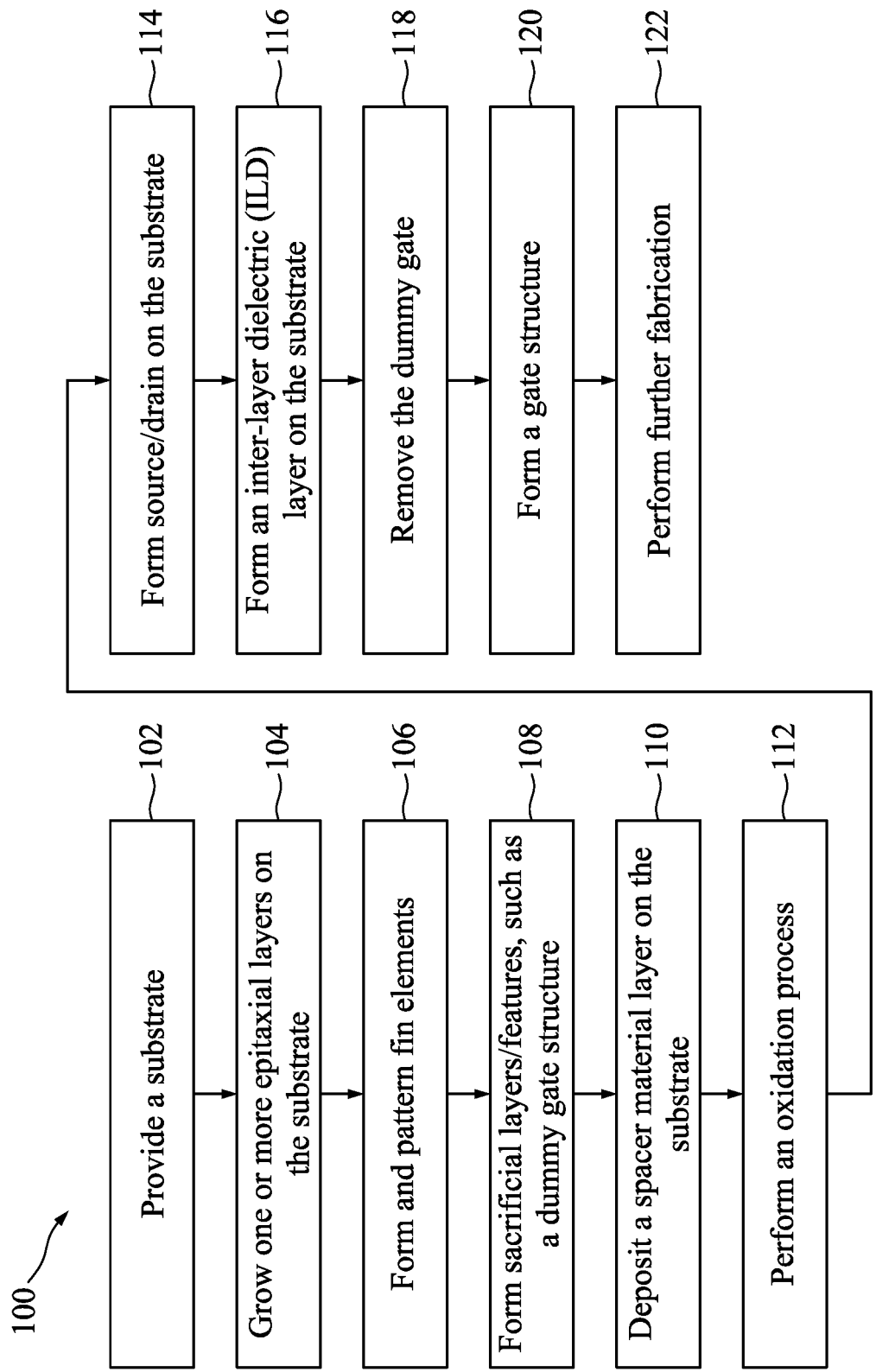
FIG. 1 is a flow chart depicting an example method of semiconductor fabrication including fabrication of multi-gate devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device.

Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

FIG. 1 is a flow chart depicting an example method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIG. 1 is described in conjunction with FIGS. FIGS. 2A-2B, 3A-3B, 4A-4B, 5A-5B, 6A-6B, 7A-7B, 8A-8B, 9A-9B and 10A-10B, which illustrate a semiconductor device 200 or structure at various stages of fabrication in accordance with some embodiments. The method 100 is merely an example and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device 200 depicted in the figures, and some of the features described below can be replaced, modified, or eliminated in other embodiments.

As with the other method embodiments and exemplary devices discussed herein, it is understood that parts of the semiconductor devices may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and/or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 100, include any descriptions given with reference to the figures, as with the remainder of the method and exemplary figures provided in this disclosure, are merely exemplary and are not intended to be limiting beyond what is specifically recited in the claims that follow.

FIGS. 2A, 3A, 4A, 5A, 6A, 7A, 8A, 9A and 10A, are isometric views of an example semiconductor device 200 and FIGS. 2B, 3B, 4B, 5B, 6B, 7B, 8B, 9B and 10B are corresponding cross-sectional side views of an embodiment of the example semiconductor device 200 along a first cut X-X' in an example fabrication process in accordance with some embodiments. In some figures, some reference numbers of components or features illustrated therein may be omitted to avoid obscuring other components or features; this is for ease of depicting the figures.

At block 102, the example method 100 includes providing a substrate 202. Referring to the example of FIGS. 2A and 2B, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Returning to FIG. 1, the method 100 then proceeds to block 104 where one or more epitaxial layers are grown on the substrate. With reference to the example of FIGS. 2A and 2B, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of the multi-gate device 200. For example, the epitaxial layers 208 may be referred to as "nanowires" used to form a channel region of a multi-gate device 200 such as a GAA device. These "nanowires" are also used to form portions of the source/drain regions of the multi-gate device 200 as discussed below. Source/drain region(s) may refer to a source or a drain, individually or collectively dependent upon the context. Again, as the term is used herein, "nanowires" refers to semiconductor layers that are cylindrical in shape as well as other configurations such as, bar-shaped. The use of the epitaxial layers 208 to define a channel or channels of a device is further discussed below.

Figure 2B:
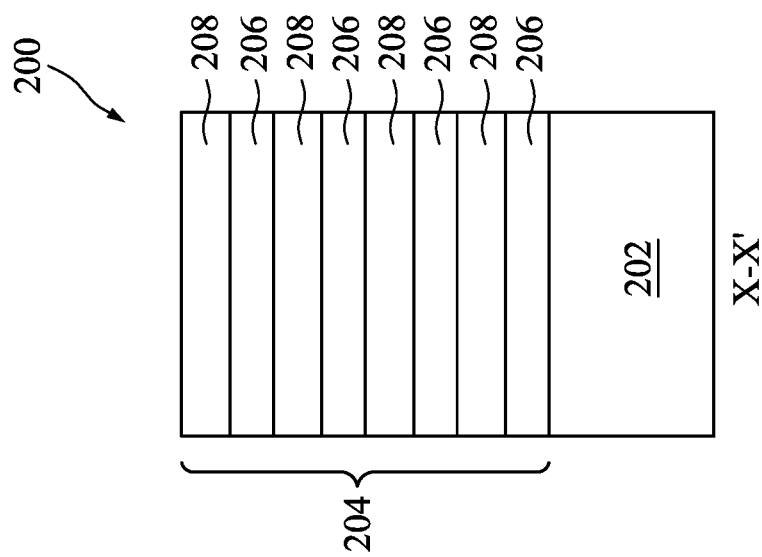
Figure 2A:
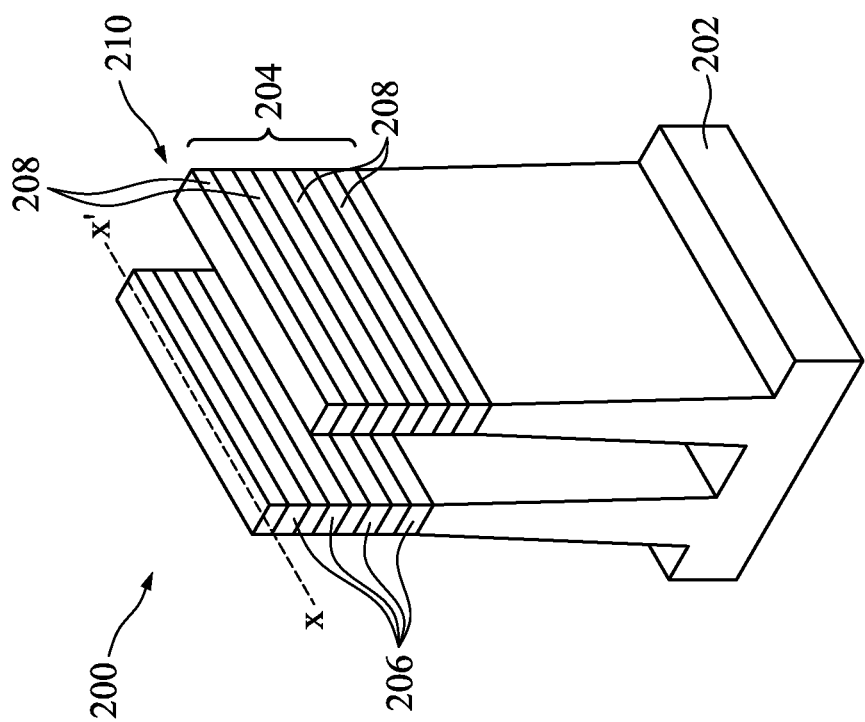

It is noted that four (4) layers of each of epitaxial layers 206 and 208 are illustrated in FIGS. 2A and 2B, this is for illustrative purposes only and not intended to be limiting beyond what is specifically recited in the claims. It can be appreciated that any number of epitaxial layers can be formed in the epitaxial stack 204; the number of layers depending on the desired number of channel regions for the device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch selectivity properties. In various embodiments, the epitaxial layers 206, 208 are substantially dopant-free (i.e., having an extrinsic dopant concentration from about 0 cm-3 to about 1×1017 cm-3), where for example, no intentional doping is performed during the epitaxial growth process.

The method 100 then proceeds to block 106 where fin elements are patterned and formed. With reference to the example of FIG. 2A, in an embodiment of block 106, a plurality of fin elements 210 extending from the substrate 202 are formed. In various embodiments, each of the fin elements 210 includes a substrate portion formed from the substrate 202, portions of each of the epitaxial layers of the epitaxial stack including epitaxial layers 206 and 208.

The fin elements 210 may be fabricated using suitable processes including photolithography and etch processes. The photolithography process may include forming a photoresist layer over the substrate 202 (e.g., over the epi stack 204), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers 204 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

In some embodiments, the dielectric layer may include SiO2, silicon nitride, silicon oxynitride, fluorine-doped silicate glass (FSG), a low-k dielectric, combinations thereof, and/or other suitable materials known in the art. In various examples, the dielectric layer may be deposited by a chemical vapor deposition (CVD) process, a sub atmospheric CVD (SACVD) process, a flowable CVD process, an atomic layer deposition (ALD) process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 302) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. The CMP process may planarize the top surface thereby forming STI features 302. The STI features 302 interposing the fin elements are recessed. Referring to the example of FIG. 3A, the STI features 302 are recessed providing the fins 210 extending above the STI features 302. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 210. The height 'H' exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin. In some embodiments, forming the fins may include a trim process to decrease the width of the fins. The trim process may include wet or dry etching processes.

The method 100 then proceeds to block 108 where sacrificial layers/features are formed and in particular, a dummy gate structure. While the present discussion is directed to a replacement gate process whereby a dummy gate structure is formed and subsequently replaced, other configurations may be possible.

Figure 3B:
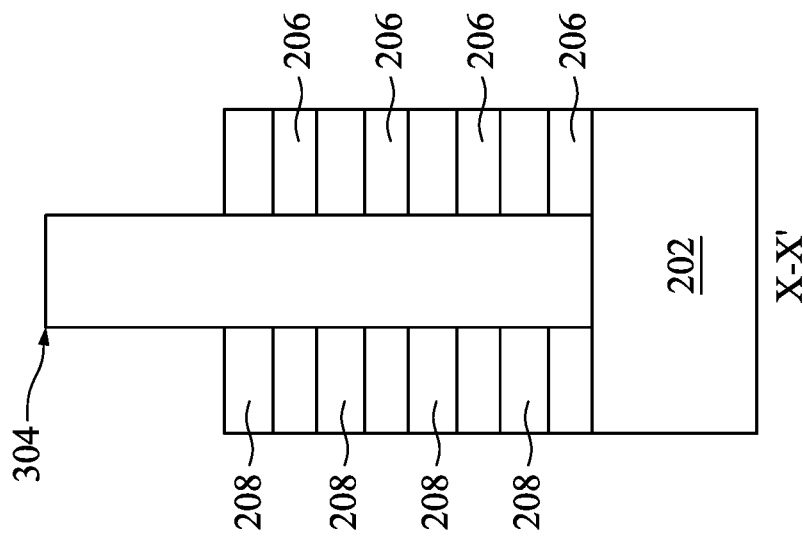
Figure 3A:
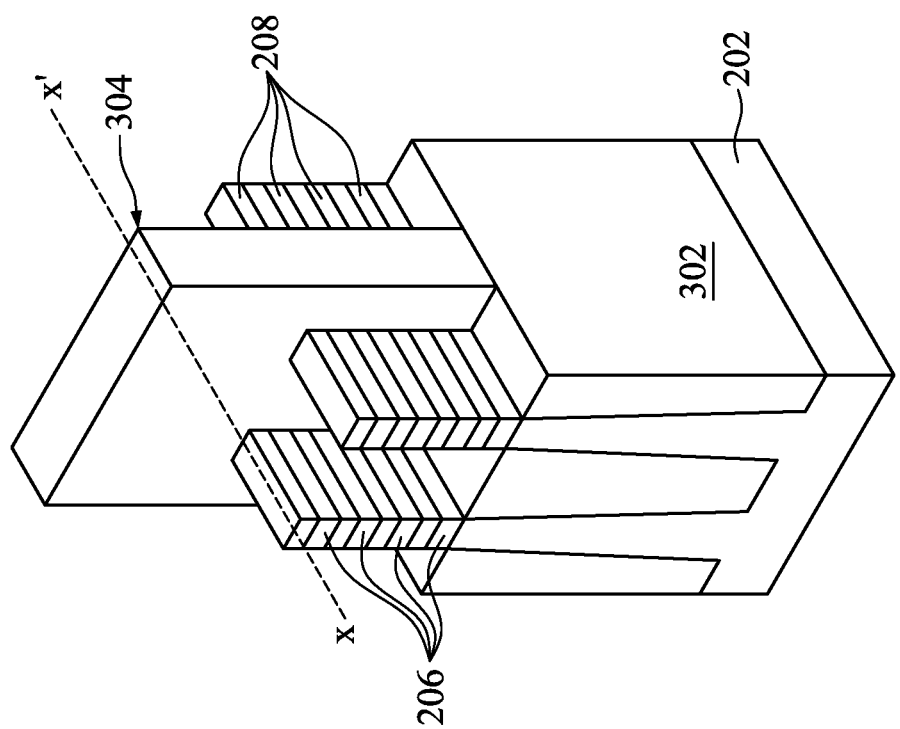

With reference to FIGS. 3A and 3B, a gate stack 304 is formed. In an embodiment, the gate stack 304 is a dummy (sacrificial) gate stack that is subsequently removed as discussed with reference to block 108 of the method 100.

Thus, in some embodiments using a gate-last process, the gate stack 304 is a dummy gate stack and will be replaced by the final gate stack at a subsequent processing stage of the device 200. In particular, the gate stack 304 may be replaced at a later processing stage by a high-K dielectric layer (HK) and metal gate electrode (MG) as discussed below. In some embodiments, the gate stack 304 is formed over the substrate 202 and is at least partially disposed over the fin elements 210. The portion of the fin elements 210 underlying the gate stack 304 may be referred to as the channel region. The gate stack 304 may also define a source/drain region of the fin elements 210, for example, the regions of the fin and epitaxial stack 204 adjacent and on opposing sides of the channel region.

In some embodiments, the gate stack 304 includes the dielectric layer and a dummy electrode layer. The gate stack 304 may also include one or more hard mask layers (e.g., oxide, nitride). In some embodiments, the gate stack 304 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 304 may include an additional gate dielectric layer. For example, the gate stack 304 may include silicon oxide. Alternatively or additionally, the gate dielectric layer of the gate stack 304 may include silicon nitride, a high-K dielectric material or other suitable material. In some embodiments, an electrode layer of the gate stack 304 may include polycrystalline silicon (polysilicon). Hard mask layers such as SiO2, Si3N4, silicon oxynitride, alternatively include silicon carbide, and/or other suitable compositions may also be included.

Figure 4B:
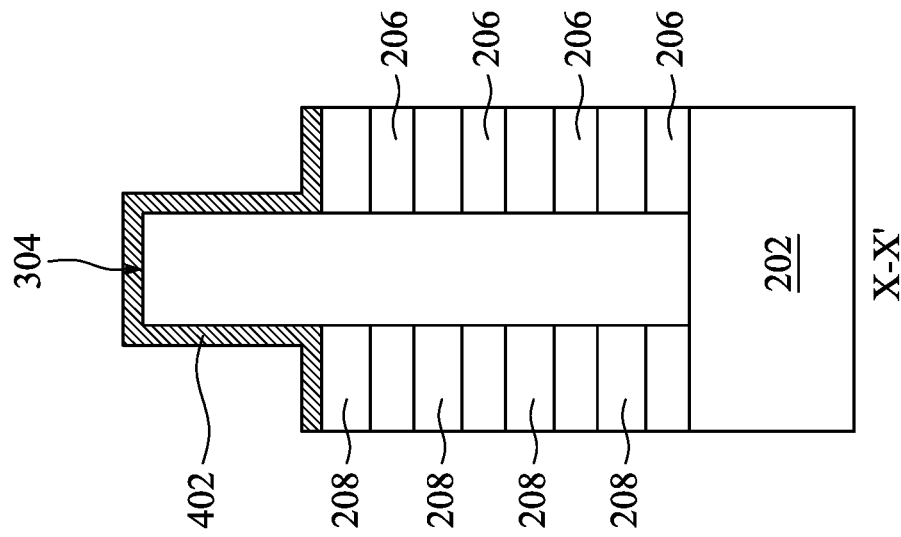
Figure 4A:
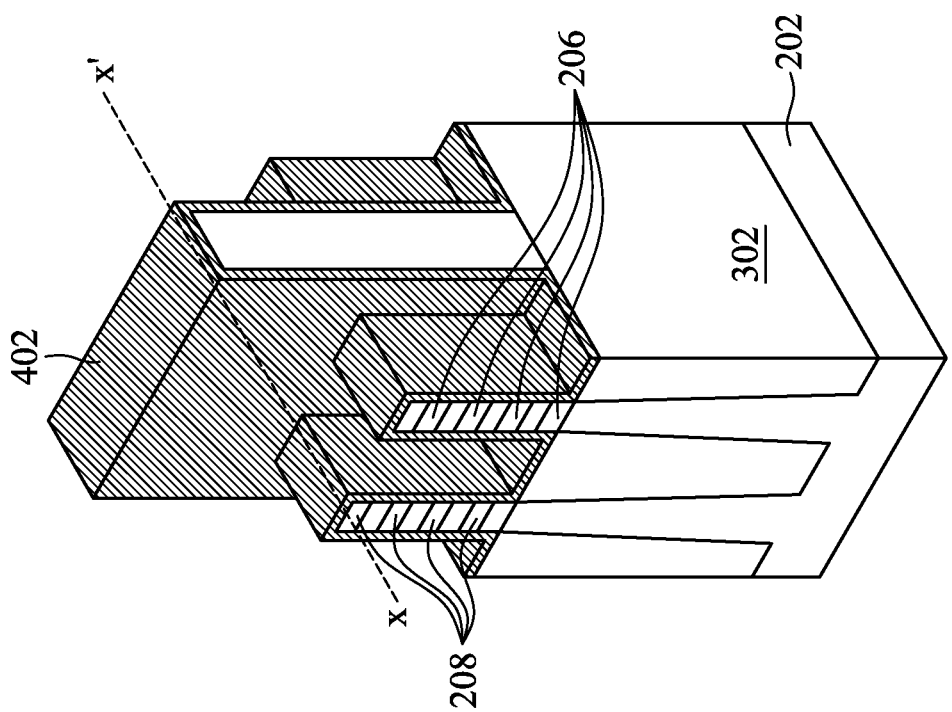

The method 100 then proceeds to block 110 where a spacer material layer is deposited on the substrate. Referring to the example of FIGS. 4A and 4B, a spacer material layer 402 is disposed on the substrate 202. The spacer layer 402 may include a dielectric material such as silicon oxide, silicon nitride, silicon carbide, silicon oxynitride, SiCN films, silicon oxycarbide, SiOCN films, and/or combinations thereof. In some embodiments, the spacer material layer 402 includes multiple layers, such as main spacer walls, liner layers, and the like. By way of example, the spacer material layer 402 may be formed by depositing a dielectric material over the gate stack 304 using processes such as, CVD process, a sub atmospheric CVD (SACVD) process, a flowable CVD process, an ALD process, a PVD process, or other suitable process. It is noted that the spacer conformal layer 402 is illustrated in FIG. 4B as covering the epitaxial stack 204.

Figure 5B:
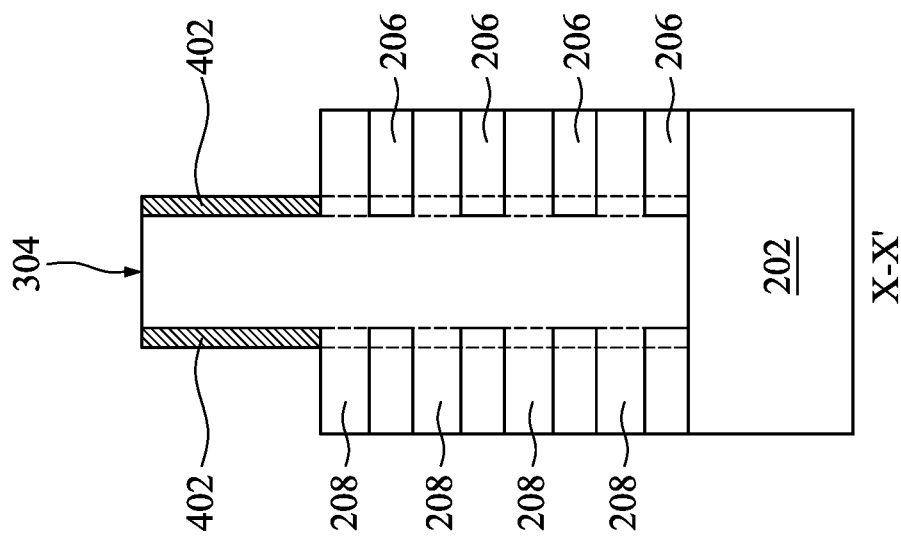
Figure 5A:
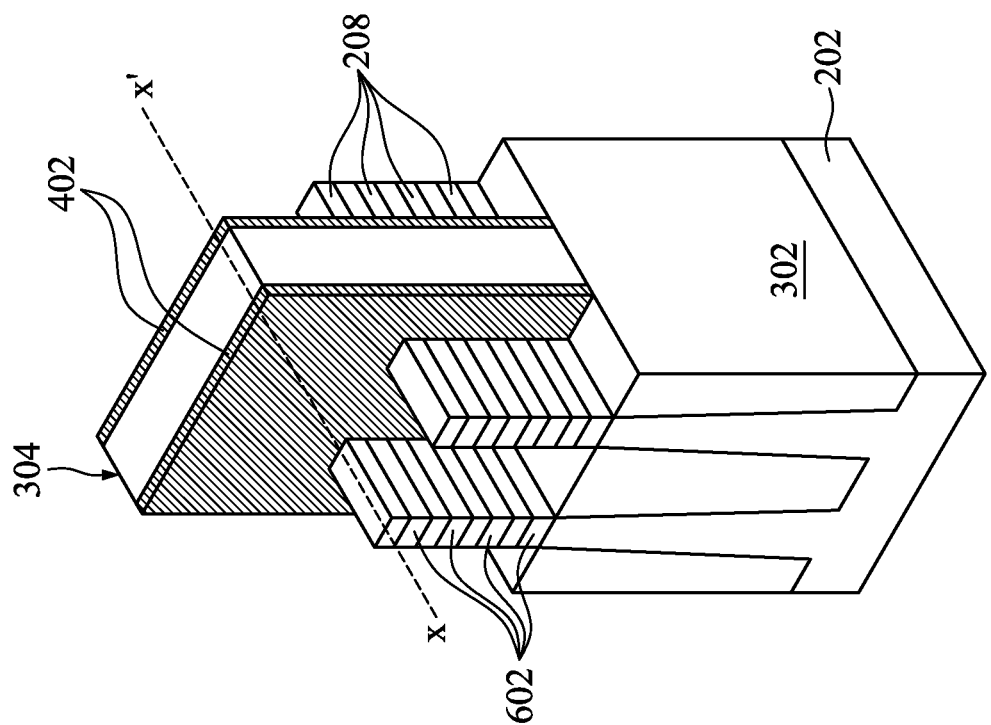
Figure 7B:
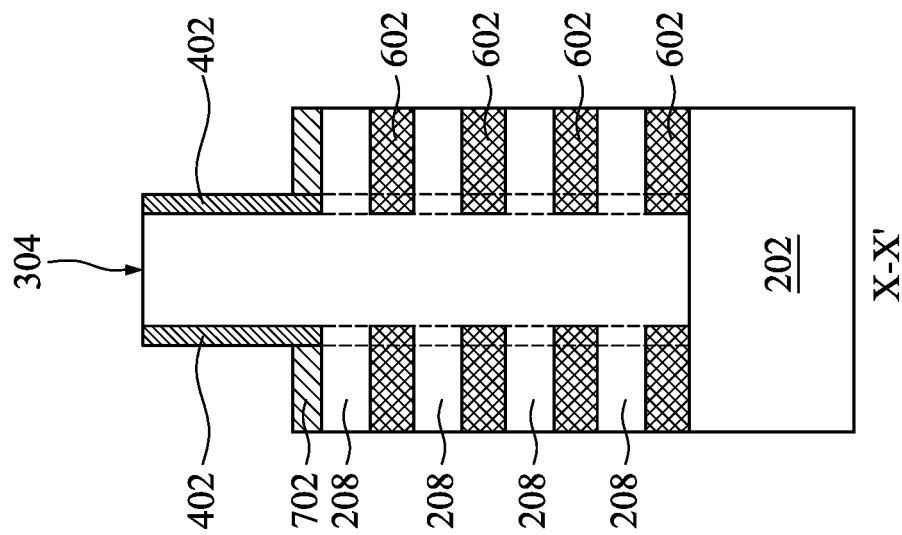
Figure 7A:
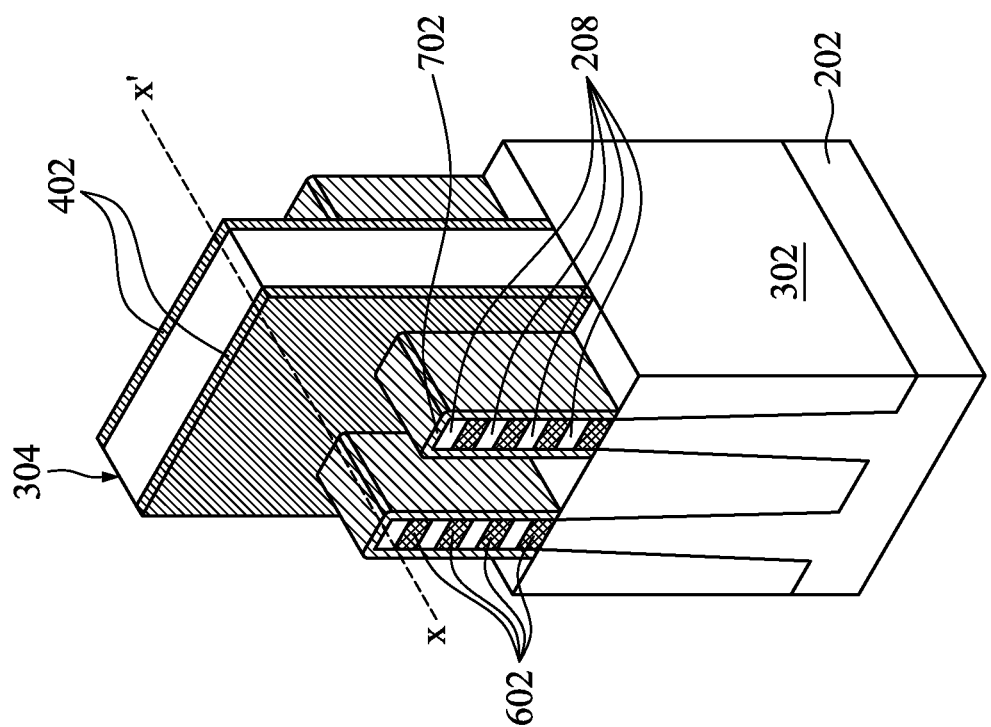
Figure 8B:
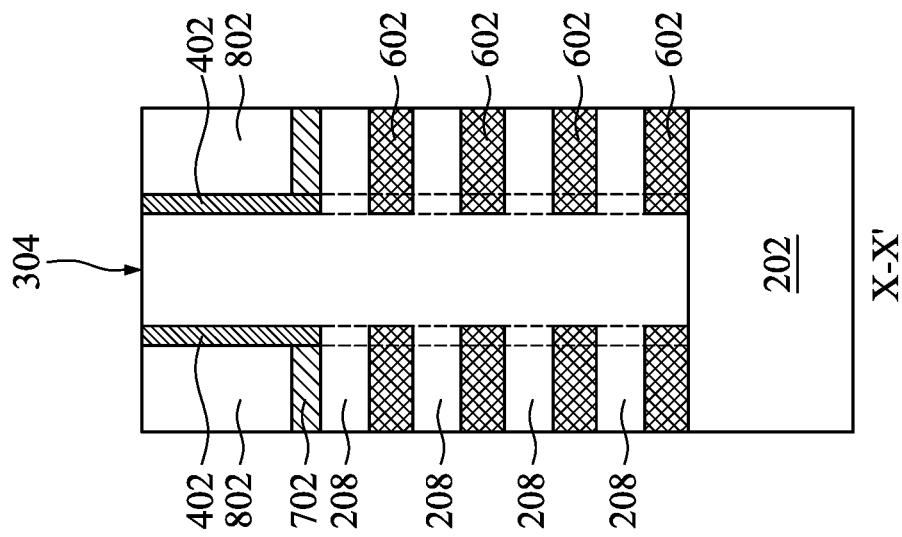
Figure 8A:
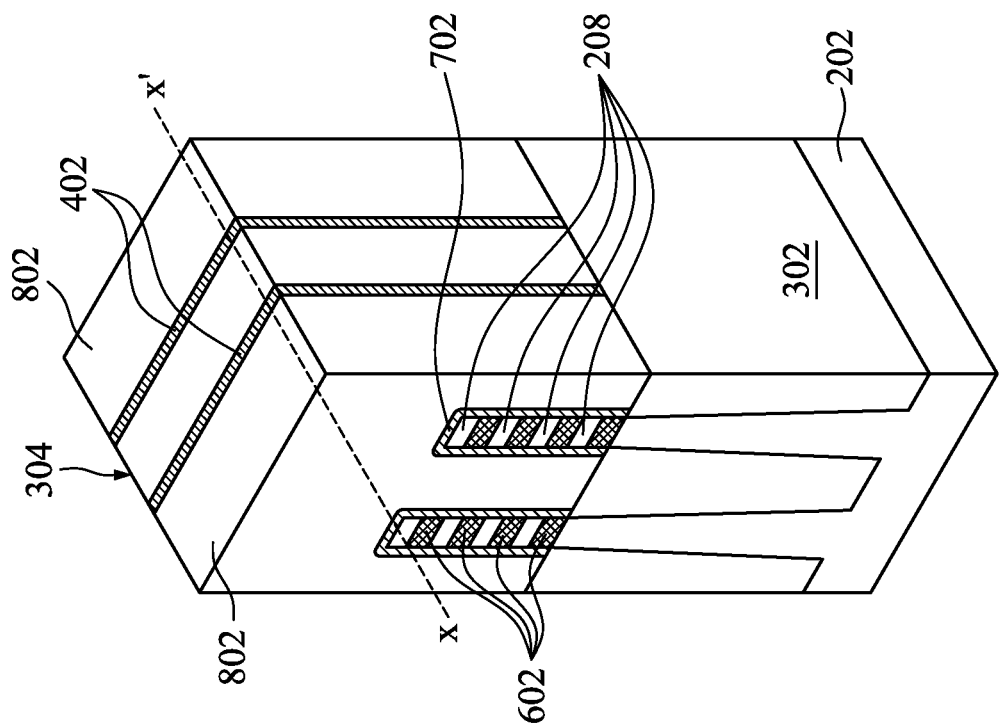
Figure 9B:
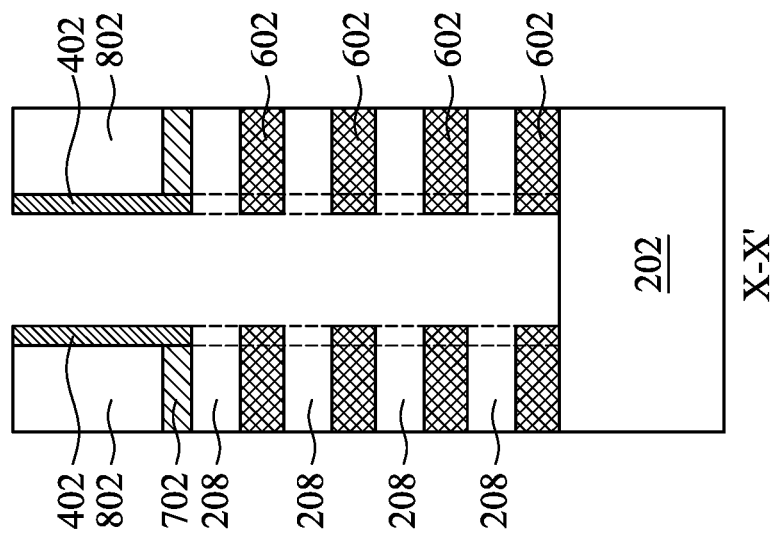
Figure 9A:
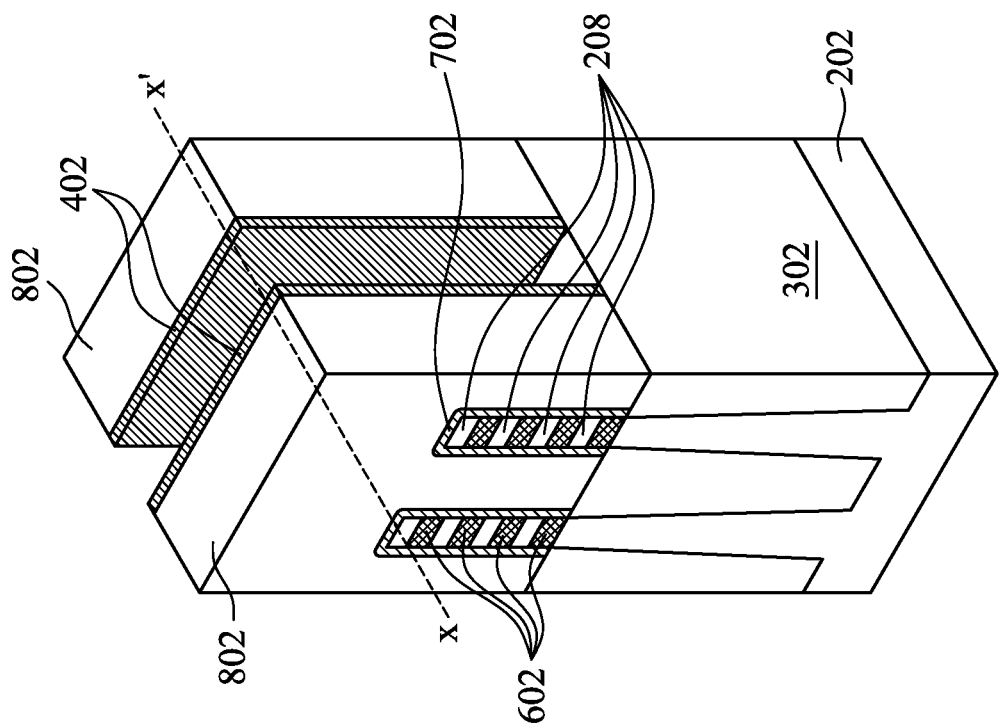

In some embodiments, the deposition of the spacer material layer is followed by an etching back (e.g., anisotropically) the dielectric spacer material. Referring to the example, with reference to the example of FIGS. 5A, 5B, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A and 5B.

The method 100 then proceeds to block 112 where an oxidation process is performed. The oxidation process may be referred to as a selective oxidation as due to the varying oxidation rates of the layers of the epitaxial stack 204, certain layers are oxidized. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. It is noted that this oxidation process may in some embodiments, extend such that the oxidized portion of the epitaxial layer(s) of the stack abuts the sidewall of the gate structure 304.

With reference to the example of FIGS. 6A and 6B, in an embodiment of block 112, the device 200 is exposed to an oxidation process that fully oxidizes the epitaxial layer 206 of each of the plurality of fin elements 210. The epitaxial layer layers 206 transform into an oxidized layer 602. The oxidized layer 602 extends to the gate structure 304, including, under the spacer elements 402. In some embodiments, the oxidized layer 602 has a thickness range of about 5 to about 25 nanometers (nm). In an embodiment, the oxidized layer 602 may include an oxide of silicon germanium (SiGeOx).

By way of example, in embodiments where the epitaxial layers 206 include SiGe, and where the epitaxial layers portion 208 includes Si, the faster SiGe oxidation rate (i.e., as compared to Si) ensures that the SiGe layer 206 becomes fully oxidized while minimizing or eliminating the oxidization of other epitaxial layers 208. It will be understood that any of the plurality of materials discussed above may be selected for each of the first and second epitaxial layer portions that provide different suitable oxidation rates.

The method 100 then proceeds to block 114 where source/drain features are formed on the substrate. The source/drain features may be formed by performing an epitaxial growth process that provides an epitaxy material on the fin 210 in the source/drain region. In an embodiment, the epitaxy material of the source/drain is formed cladding the portions of the epitaxy layers remaining in the fins' source/drain regions. Referring to the example of FIGS. 7A and 7B, source/drain features 702 are formed on the substrate 202 in/on the fin 210 adjacent to and associated with the gate stack 304. The source/drain features 702 include material formed by epitaxially growing a semiconductor material on the exposed epitaxial layer 208 and/or oxidized layer 602. It is noted that the shape of the features 702 is illustrative only and not intended to be limiting; as understood by one of ordinary skill in the art, any epitaxial growth will occur on the semiconductor material (e.g., 208) as opposed to the dielectric material (e.g., 602), the epitaxial growth may be grown such that it merges over a dielectric layer (e.g., over 602) as illustrated.

In various embodiments, the grown semiconductor material of the source/drain 702 may include Ge, Si, GaAs, AlGaAs, SiGe, GaAsP, SiP, or other suitable material. In some embodiments, the material of the source/drain 702 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or both carbon and phosphorous to form SiCP source/drain features. In an embodiment, the epitaxial material of the source/drain 702 is silicon and the layer 208 also is silicon. In some embodiments, the layers 702 and 208 may comprise a similar material (e.g., Si), but be differently doped. In other embodiments, the epitaxy layer for the source/drain 702 includes a first semiconductor material, the epitaxially grown material 208 includes a second semiconductor different than the first semiconductor material. In some embodiments, the epitaxially grown material of the source/drain 702 is not in-situ doped, and, for example, instead an implantation process is performed.

The method 100 then proceeds to block 116 where an inter-layer dielectric (ILD) layer is formed on the substrate. Referring to the example of FIGS. 8A and 8B, in an embodiment of block 116, an ILD layer 802 is formed over the substrate 202. In some embodiments, a contact etch stop layer (CESL) is also formed over the substrate 202 prior to forming the ILD layer 802. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 802 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 802 may be deposited by a PECVD process or other suitable deposition technique. In some embodiments, after formation of the ILD layer 802, the semiconductor device 200 may be subject to a high thermal budget process to anneal the ILD layer.

In some examples, after depositing the ILD (and/or CESL or other dielectric layers), a planarization process may be performed to expose a top surface of the gate stack 304. For example, a planarization process includes a chemical mechanical planarization (CMP) process which removes portions of the ILD layer 802 (and CESL layer, if present) overlying the gate stack 304 and planarizes a top surface of the semiconductor device 200.

The method 100 then proceeds to block 118 where the dummy gate (see block 108) is removed. The gate electrode and/or gate dielectric may be removed by suitable etching processes. In some embodiments, block 118 also includes selective removal of the epitaxial layer(s) in the channel region of the device is provided. In embodiments, the selected epitaxial layer(s) are removed in the fin elements within the trench provided by the removal of the dummy gate electrode (e.g., the region of the fin on and over which the gate structure will be formed, or the channel region). Referring to the example of FIGS. 9A and 9B, the epitaxy layers 206 are removed from the channel region of the substrate 202 and within the trench. In some embodiments, the epitaxial layers 206 are removed by a selective wet etching process. In some embodiments, the selective wet etching includes HF. In an embodiment, the epitaxial layers 206 are SiGe and the epitaxial layers 208 are silicon allowing for the selective removal of the SiGe epitaxial layers 206.

The method 100 then proceeds to block 120 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region. Exemplary embodiments of the gate structure will be discussed in more detail.

Figure 10B:
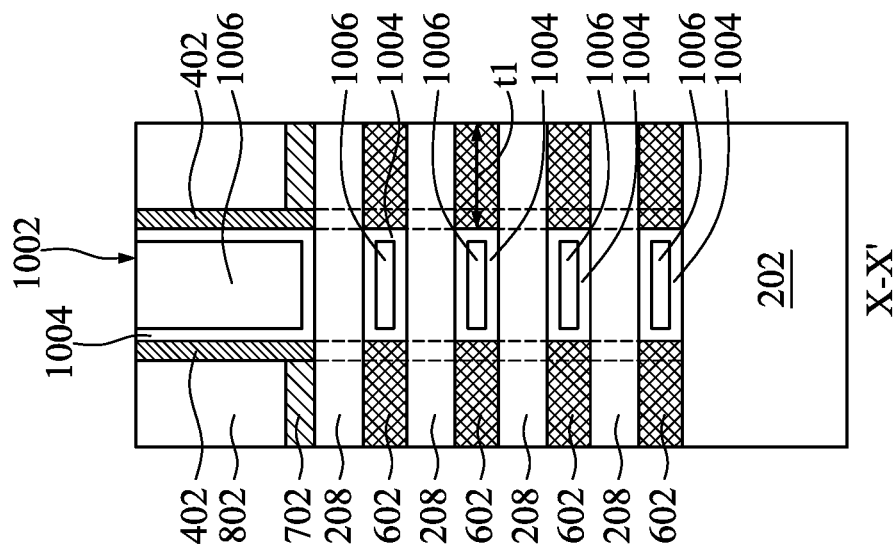
Figure 10A:
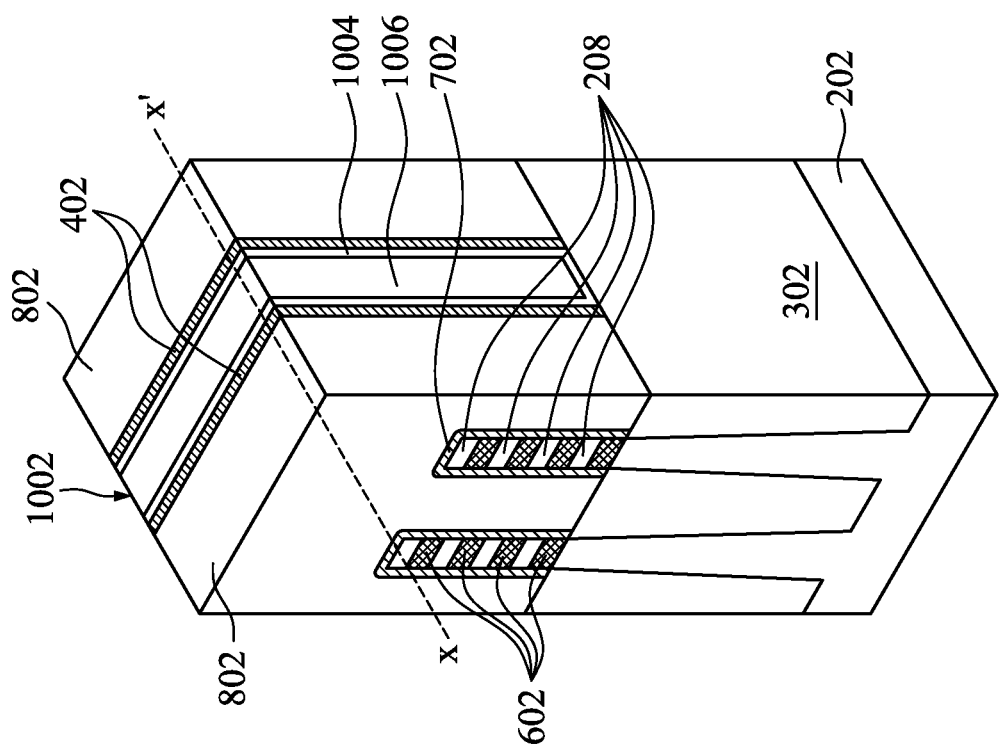

Referring to the example of FIGS. 10A and 10B, in an embodiment of block 120, a high-K/metal gate stack 1002 is formed within the trench of the device 200 provided by the removal of the dummy gate and/or release of nanowires, described above with reference to block 118. In various embodiments, the high-K/metal gate stack 1002 includes an interfacial layer, a high-K gate dielectric layer 1004 formed over the interfacial layer, and/or a metal layer 1006 formed over the high-K gate dielectric layer 1004. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1002 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 1004 of the gate stack 1002 may include a high-K dielectric layer such as hafnium oxide ($HfO_2$). Alternatively, the gate dielectric layer 1004 of the gate stack 1002 may include other high-K dielectrics, such as TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The high-K gate dielectric layer 1004 may be formed by ALD, physical vapor deposition (PVD), CVD, oxidation, and/or other suitable methods. The metal layer of the high-K/metal gate stack 1002 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer of gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1002 may be formed by ALD, PVD, CVD, e-beam evaporation, or other suitable process. Further, the metal layer of the gate stack 1002 may be formed separately for N-FET and P-FET transistors which may use different metal layers. In various embodiments, a CMP process may be performed to remove excessive metal from the metal layer of the gate stack 1002, and thereby provide a substantially planar top surface of the metal layer of the gate stack 1002. The metal layer 1006 of the gate stack 1002 is illustrated in FIGS. 10A and 10B. In addition, the metal layer may provide an N-type or P-type work function, may serve as a transistor (e.g., FinFET) gate electrode, and in at least some embodiments, the metal layer of the gate stack 1002 may include a polysilicon layer. The gate structure 1002 includes portions that interpose each of the epitaxial layers 306, which each form channels of the multi-gate device 200.

In some embodiments, anti-reaction layers may be included in the gate stack 1002 to prevent oxidation. In some embodiments, the anti-reaction layers may comprise dielectric materials. In some embodiments, the anti-reaction layers may comprise silicon-based materials. In some embodiments, the anti-reaction layers may comprise silicon (Si), silicon oxide (SiO$_x$), silicon nitride (SiN), silicon oxynitride (SiON), silicon carbonitride (SiCN), silicon carbide (SiC), combinations or multiple layers thereof, or the like. However, any suitable material may be utilized. The anti-reaction layers may be deposited conformally by using a deposition process such as ALD, CVD, PVD, or the like. The anti-reaction layers may be deposited to thicknesses ranging from about 0.3 nm to about 5 nm.

In some embodiments, a glue layer may be included in the gate stack 1002. The glue layer may include any acceptable material to promote adhesion and prevent diffusion. For example, the glue layer may be formed of a metal or metal nitride such as titanium nitride, titanium aluminide, titanium aluminum nitride, silicon-doped titanium nitride, tantalum nitride, or the like, which may be deposited by ALD, CVD, PVD, or the like.

In an embodiment, the gate structure comprises a high-k dielectric layer, a p-type work function layer over the high-k dielectric layer, an n-type work function layer over the p-type work function layer, an anti-reaction layer over the n-type work function layer, and a glue layer over the anti-reaction layer. The gate structure may comprise different or additional layers or may omit layers discussed above. The layers of the gate structure may also be deposited in a different order. Additional layers may include barrier layers, diffusion layers, adhesion layers, combinations or multiple layers thereof, or the like. In some embodiments, the additional layers may comprise materials including chlorine (Cl) or the like. The additional layers may be deposited by ALD, CVD, PVD, or the like.

The method 100 then proceeds to block 122 wherein further fabrication is performed. A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 100, and some process steps described above may be replaced or eliminated in accordance with various embodiments of the method 100.

Figure 11:
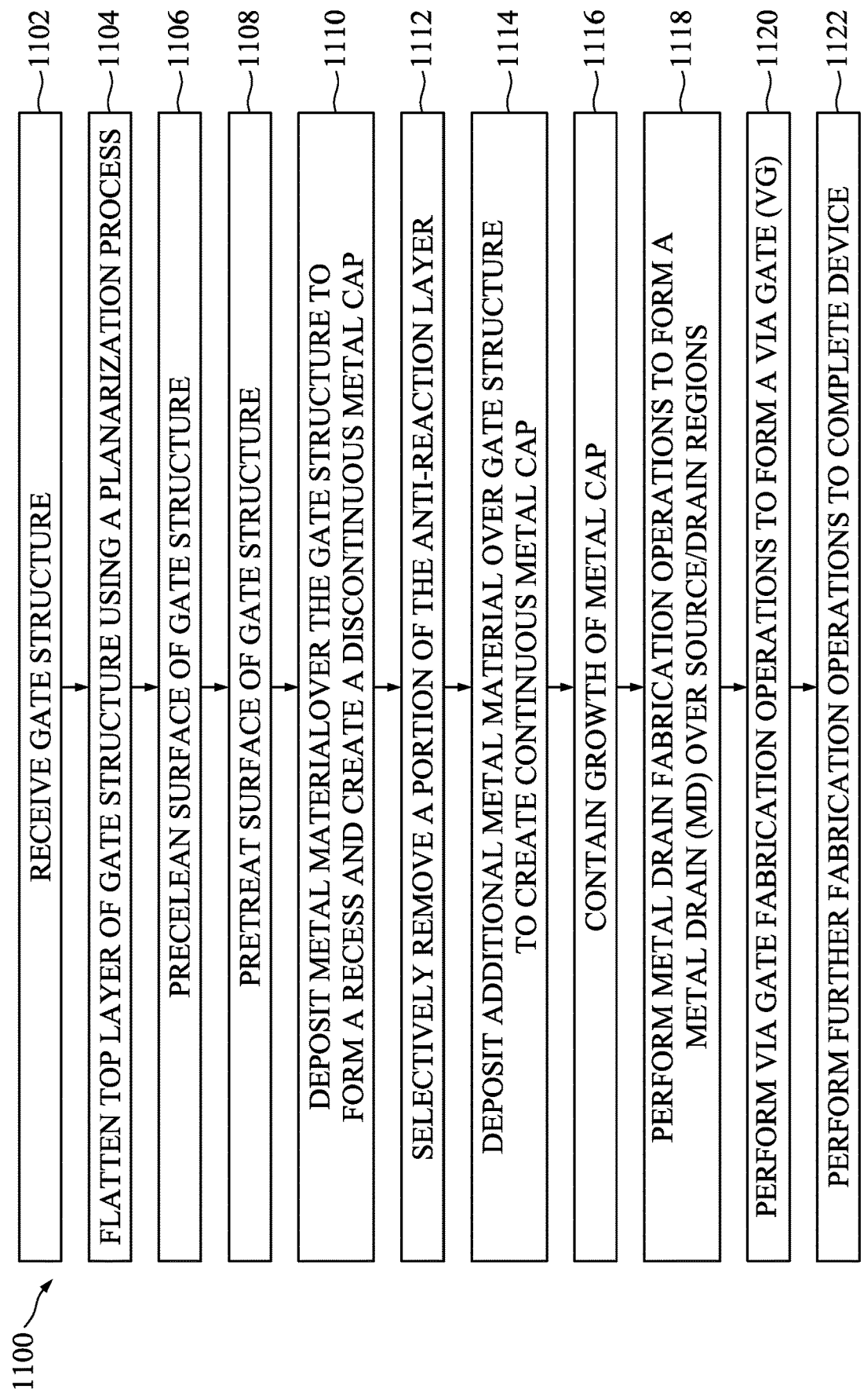
FIG. 11 is a flow chart depicting an example fabrication method for fabricating a continuous metal cap over a metal gate for use with a subsequently fabricated via gate (VG) conductor, in accordance with some embodiments.

FIG. 11 is a flow chart depicting an example method 1100 of further semiconductor fabrication, after formation of a metal gate structure, including fabrication of a continuous metal cap for use with a subsequently fabricated via gate conductor. FIG. 11 is described in conjunction with FIGS. 12A-12G, which illustrate a semiconductor device or structure at various stages of fabrication in accordance with some embodiments. The method 1100 is merely an example and is not intended to limit the present disclosure beyond what is explicitly recited in the claims. Additional steps may be provided before, during, and after method 1100, and some of these steps describe can be moved, replaced, or eliminated for additional embodiments of method 1100. Additional features may be added in the semiconductor device depicted in the figures, and some of the features described below can be replaced, modified, or eliminated in other embodiments.

FIGS. 12A-12G are diagrams depicting enlarged views of an example gate structure 1200 (analogous to the top portions shown in FIGS. 2B-10B) at various stages of fabricating a metal cap above a metal gate stack, in accordance with some embodiments. In some figures, some reference numbers of components or features illustrated therein may be omitted to avoid obscuring other components or features; this is for ease of depicting the figures.

A metal cap may be formed over a metal gate structure as an intermediary for connecting a via gate (VG) conductor to the metal gate structure. Use of a metal cap to connect a VG conductor to a metal gate structure can result in reduced gate resistance (Rg) versus connecting a VG conductor directly to the metal gate structure. Use of a metal cap, consequently, can improve device performance.

An anti-reaction layer may be included in a metal gate structure to prevent oxidation of the P-metal and N-metal and to improve device performance. An anti-reaction layer, however, may impede the formation of a metal cap over the metal gate structure. Method 1100 presents an exemplary process for forming a metal cap over a metal gate structure without an anti-reaction layer impeding the formation of a metal cap and also for gate height scaling with a metal cap thickness of about 3-4 nm.

At block 1102, the example method 1100 includes receiving a gate structure having a high-k dielectric layer, a p-type work function layer over the high-k dielectric layer, an n-type work function layer over the p-type work function layer, an anti-reaction layer over the n-type work function layer, and a glue layer over the anti-reaction layer.

At block 1104, the top layer of the gate structure is flattened using a planarization process to create a level surface by removing excess material. The planarization process may be, for example, a chemical mechanical polishing (CMP) process, an etch-back process, combinations thereof, or the like.

Figure 12A:
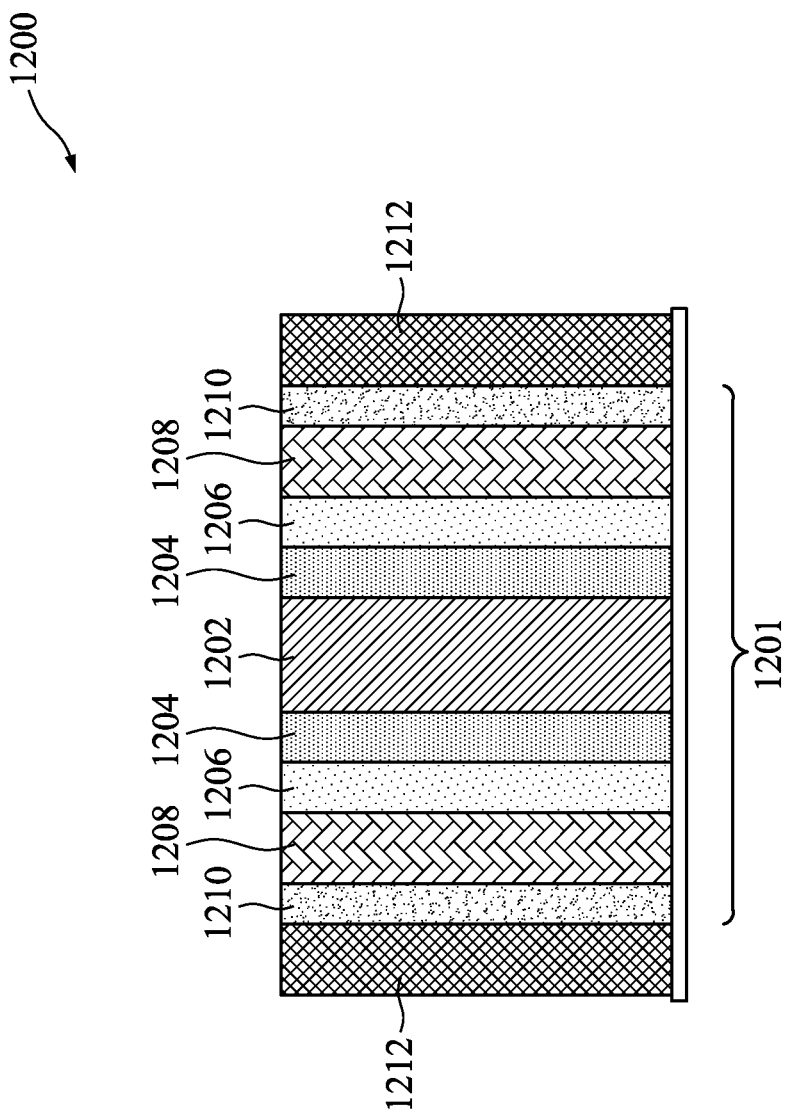
FIGS. 12A-12H are diagrams depicting enlarged views of an example semiconductor gate structure at various stages of fabricating a continuous metal cap above a metal gate, in accordance with some embodiments.

FIG. 12A illustrates an example gate structure 1200 (analogous to the top portions shown in FIGS. 2B-10B) after metal gate (MG) formation and after the completion of a planarization process in block 1104. The example gate structure 1200 includes gate spacers 1212 and a MG or gate stack 1201. The example gate stack 1201 includes a high-k dielectric layer 1210, a p-type work function layer 1208 adjacent to the high-k interlayer dielectric (ILD) material 1210, an n-type work function layer 1206 adjacent to the p-type work function layer 1208, an anti-reaction layer 1204 adjacent to the n-type work function layer 1206, and a glue layer 1202 adjacent to the anti-reaction layer 1204.

The example gate stack 1201 may be used with an n-channel metal-oxide semiconductor (NMOS) or a p-channel metal-oxide semiconductor (PMOS). In embodiments used with an NMOS semiconductor device, the gate stack 1201 may contain both an N-metal layer 1206 and a P-metal layer 1208, or the gate stack 1201 may contain only an N-metal layer 1206 and no P-metal layer 1208. In embodiments used with a PMOS semiconductor device, the gate stack 1201 may contain both an N-metal layer 1206 and a P-metal layer 1208, or the gate stack 1201 may contain only a P-metal layer 1208 and no N-metal layer 1206.

At block 1106, the surface of the gate structure is precleaned to remove any excess soil or particles to ensure successful coverage of the gate structure during subsequent deposition operations. In an embodiment, the surface of the gate structure is precleaned by rinsing with a deionized (DI) water solution. In an embodiment, a DI water solution may be delivered for about 28 seconds, for example. The cleaning solution may be at ambient temperature or may be heated or cooled to a different temperature.

At block 1108, the surface of the gate structure is pretreated to effect surface modification and selective growth enhancement. In some embodiments, the pretreatment is a plasma treatment 1214, for example an oxygen ($O_2$) plasma or a nitrogen/hydrogen ($N_2/H_2$) plasma. In some embodiments, a light plasma treatment is applied. After the pretreatment process, part of the titanium nitride in the metal gate layers 1206 and 1208 have been converted to titanium oxide or titanium oxynitride. In various embodiments, this pretreatment can be used for metal gates such as nitride based, carbide based and pure metal (for example, acids for Co and bases for Al) based on optimizing the process. Both $O_2$ and $N_2/H_2$ are suitable for pretreatment through process tuning on TiN, TaC and TiC based metal gate.

The plasma treatment procedure may be a plasma cleaning operation that includes hydrogen ($H_2$) and nitrogen ($N_2$) at a temperature of about 100° C. to 300° C. In an exemplary embodiment, the hydrogen:nitrogen gas ratio may range from about 10:1 to about 2:1 by controlling gas flow, but other ratios may be used in other exemplary embodiments. In an exemplary embodiment, a gas flow of about 500 sscm to about 5000 sscm $H_2$ and about 500 sscm to about 10000 sscm $N_2$ may be used at a pressure of about 0.5 torr to about 50 torr and at a source power of 2500 watts of an inductively coupled plasma. In other exemplary embodiments, the power used in the cleaning chamber may range from about 150 W to about 3000 W. The plasma pretreatment is used to passivate the surface of the gate structure rather than sputtering.

Figure 12B:
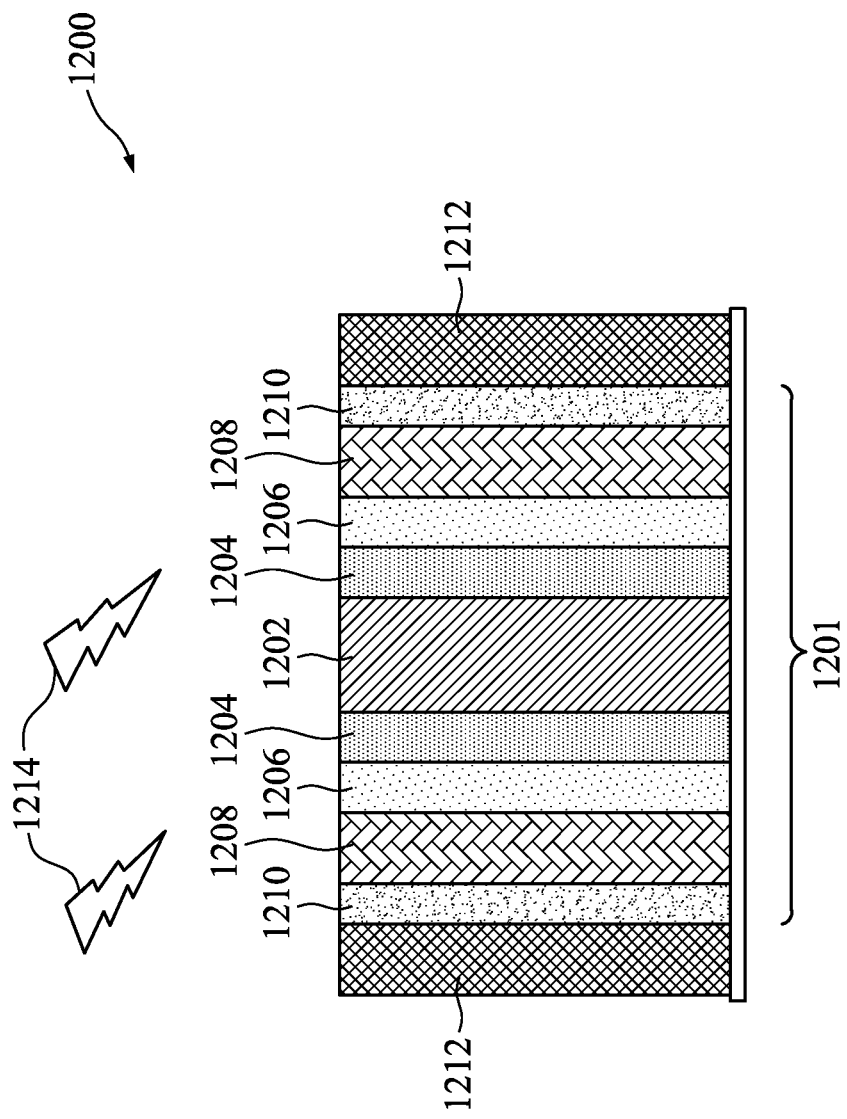

FIG. 12B illustrates the gate structure 1200 after the completion of the precleaning in block 1106 and the pretreatment in block 1108. The pretreatment results in a surface modification using a plasma treatment 1214.

At block 1110, metal material is deposited over the metal gate stack using selective deposition. The metal material may be deposited by CVD or ALD. In an exemplary embodiment, the metal material is deposited through an ALD process. During the deposition process, chloride in the precursor reacts with titanium oxide in the metal gate stack 1201, forming a recess in the P-metal 1208, in the N-metal 1206, an in the HK material. The delta of the etching rate between the metal and the HK material affects how much of the HK material is etched and the slope of the recess in the HK material. Metal material is selectively deposited in the recess and over the HK 1210, P metal 1208, and the N metal 1206 layers of the gate stack 1201. In various embodiments, WCl5 reacts with surface Ti—O to form WOClx and TiOCly as vapor. The TiOCly vapor is pumped out helping to form the recess. The metal material forms a discontinuous metal cap 1216 over the gate stack 1201. Because the anti-reaction has dielectric like properties, metal cap growth is inhibited on the anti-reaction layer.

The metal cap 1216 may be, for example, tungsten (W) or molybdenum (Mo). In some examples, $WCl_5$ is used to deposit a W cap over the anti-reaction layer 1204, which may be composed of a silicon containing material such as silicon nitride (SiN) or silicon oxide ($SiO_x$).

In embodiments in which the conductive cap material comprises tungsten, the conductive cap material may be deposited using a tungsten chloride ($WCl_5$) precursor, a hydrogen ($H_2$) reducing gas, and an argon (Ar) carrier gas at a temperature ranging from about 300° C. to about 500° C. and a process pressure ranging from about 10 Torr to about 50 Torr. The tungsten chloride precursor may be supplied at a temperature ranging from about 100° C. to about 150° C. In some embodiments, the conductive cap material may further comprise chlorine having an atomic concentration ranging from about 0.5% to about 5%. Alternatively, a similar ALD process can be used to deposit Mo using a molybdenum chloride ($MoCl_5$) precursor, a $H_2$ reducing gas, and an Ar carrier gas at a temperature of about 300° C. to form a Mo cap.

After completion of the deposition process at block 1110, a discontinuous metal cap 1216 has been formed over the metal gate stack 1201. In some embodiments, the thickness of the discontinuous metal cap 1216 is about 1-2 nm. The thickness of the discontinuous metal cap 1216 may not be uniform due to the high atomic number of W relative to metal gate and can be determined through TEM analysis. The partial metal cap 1216 acts as an etching mask during the subsequent process steps to ensure that the P-metal 1208 and N-metal 1206 are not damaged during removal of a portion of the anti-reaction layer 1204 at block 1112.

Figure 12C:
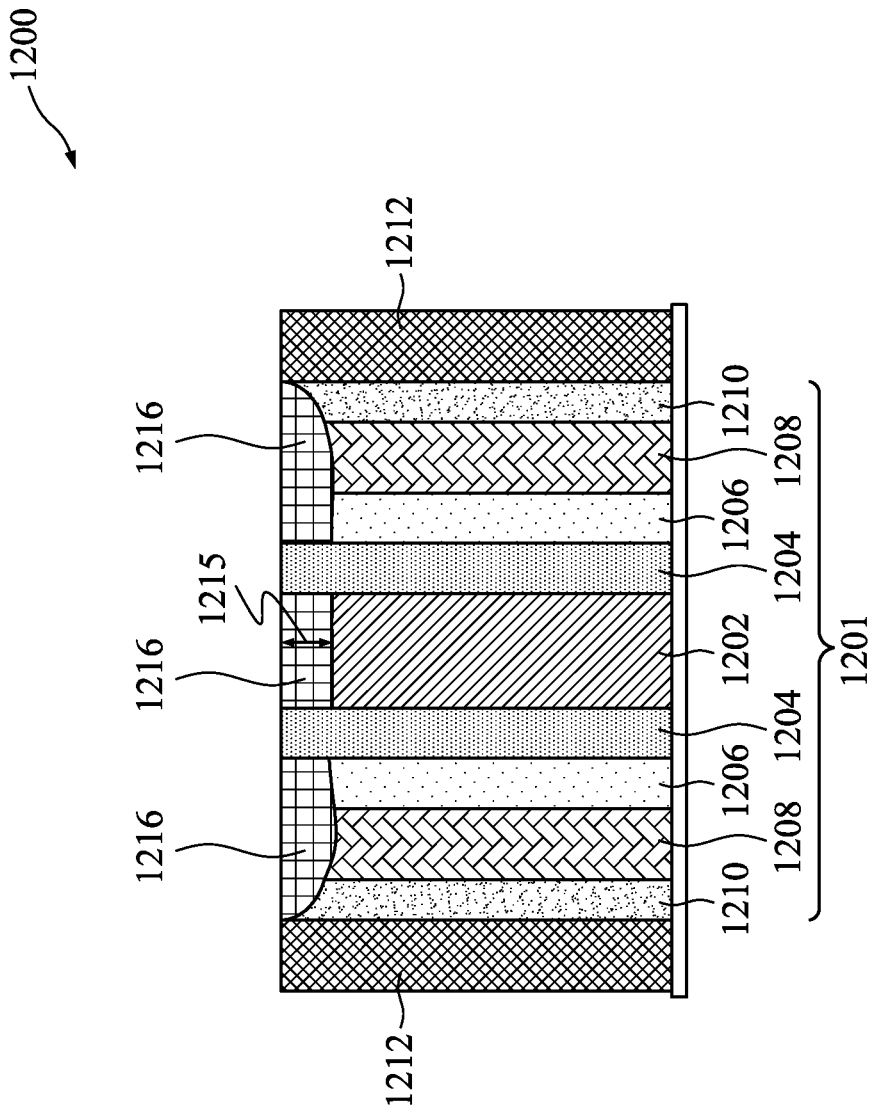

FIG. 12C depicts the gate structure 1200 after deposition of metal material to form a partial metal cap in block 1110. The gate structure 1200 has been modified to include a discontinuous metal cap 1216.

The anti-reaction layer 1204 inhibits the deposition of the metal material because the WCl5 is less reactive with the dielectric surface of the anti-reaction layer than the remainder of the gate stack. A portion of the anti-reaction layer is to be selectively removed to allow deposition of additional metal material to create a continuous metal cap over the gate stack 1201. The anti-reaction layer 1204 may be composed of a silicon containing material. In some embodiments, the anti-reaction layer 1204 may be SiN or SiO$_x$. The anti-reaction layer 1204 protects the P-metal 1208 and the N-metal 1206 from the etching process, improves properties of the metal cap 1220 such as the threshold voltage shift ($V_{ts}$), and prevents degradation. However, the anti-reaction layer 1204 inhibits metal cap coverage because of the dielectric properties of the silicon containing material.

At block 1112, a portion of the anti-reaction layer 1204 is selectively removed to leave recesses 1218. Removal of the anti-reaction layer 1204 proceeds to the depth at which the discontinuous metal cap 1216 has been deposited, which may be about 1-2 nm, wherein the depth of the recess is an average mean value 1215 and the recess is defined as the gap toward the surface of spacer. Accordingly, a portion of the anti-reaction layer 1204 is removed such that the resulting recesses 1218 have a depth approximately equal to the thickness of the discontinuous metal cap 1216. Removal of a portion of the anti-reaction layer 1204 may be accomplished through a wet chemical process. The wet chemical process dissolves and removes the anti-reaction layer 1204, which may comprise silicon oxide or another dielectric material, but the wet chemical process does not dissolve the metal material of the partial metal cap 1216. The presence of the partial metal cap 1216 protects the P-metal 1208 and the N-metal 1206 from the effects of the wet chemical process. In an embodiment, the entire gate structure 1200 is rinsed with an etching solution.

The etching solution may be a dilute hydrofluoric acid (HF). The HF is diluted by deionized water. In some embodiments, the ratio by volume of HF to deionized water is about 1:500. In other embodiments, the ratio by volume of HF to deionized water is about 1:2000. Alternatively, the etching solution may be, for example, MR1. Etching solution MR1 comprises 1 part ammonium hydroxide (NH$_4$OH), about 1 to about 10 parts hydrogen peroxide (H$_2$O$_2$), and about 5 to about 30 parts water (H$_2$O). In some embodiments, other etching solutions may be used, or the components of the etching solution may be mixed in different ratios.

Figure 12D:
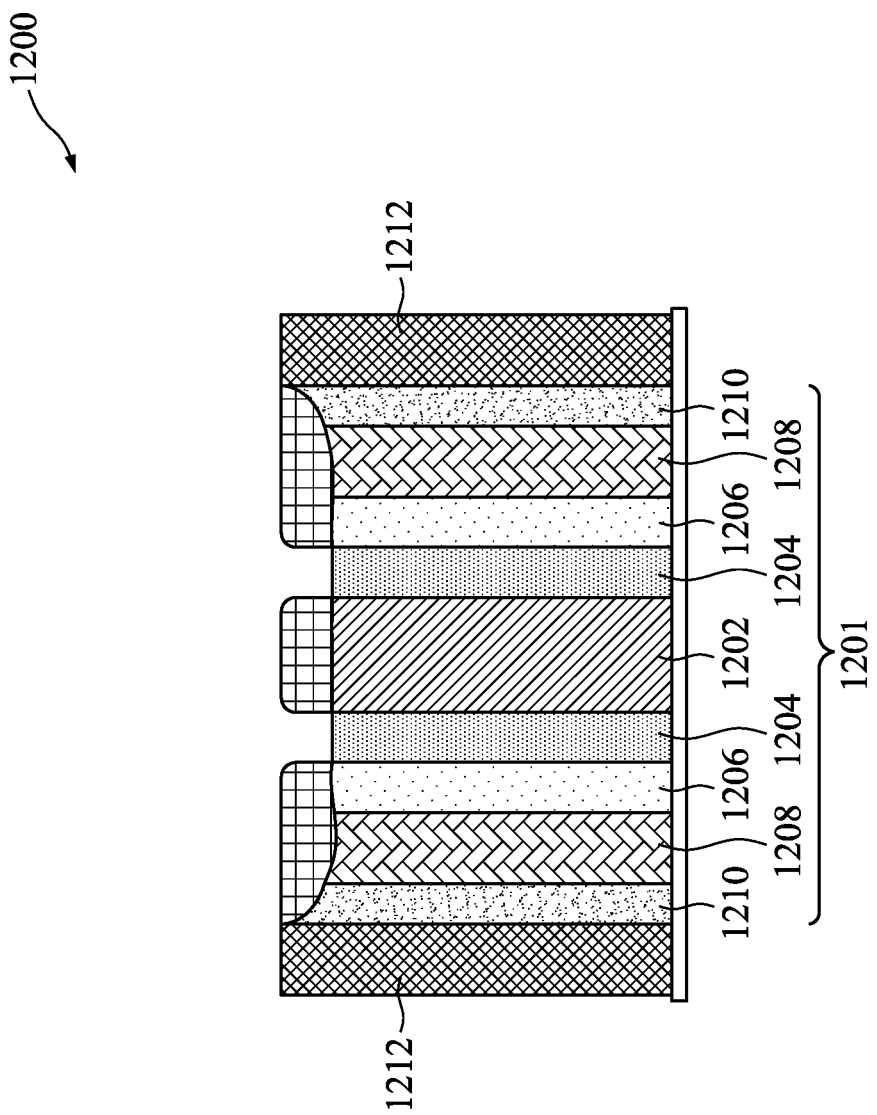

FIG. 12D illustrates the gate structure 1200 after selective removal of a portion of the anti-reaction layer 1204 to form recesses 1218 in block 1112.

At block 1114, additional metal material is deposited to form a continuous metal cap 1220. In some embodiments, the process in block 1114 is the same as the process in block 1110. In other embodiments, a variation of the process in block 1110 is used in block 1114. In still other embodiments, a different deposition process is used in block 1114 than in block 1110.

Additional metal material is deposited over the metal gate structure 1200. The metal material may be deposited by CVD, ALD, electroless deposition (ELD), PVD, electroplating, a combination thereof, or another deposition technique. In an exemplary embodiment, the metal material is deposited through an ALD process. The metal material deposited at block 1114 fills in the recesses 1218 to form a continuous metal cap 1220 over the metal gate stack 1201. The metal material may also partially cover the spacers 1212.

The metal material deposited in block 1114 is the same metal material deposited in block 1110, which may be, for example, W or Mo. In an exemplary embodiment, W may be deposited using a tungsten chloride (WCl$_5$) precursor, a hydrogen (H$_2$) reducing gas, and an argon (Ar) carrier gas at a temperature ranging from about 300° C. to about 500° C. and a process pressure ranging from about 10 Torr to about 50 Torr. The tungsten chloride precursor may be supplied at a temperature ranging from about 100° C. to about 150° C. In some embodiments, the conductive cap material may further comprise chlorine having an atomic concentration ranging from about 0.5% to about 5%. Alternatively, the precursor may be tungsten fluoride (WF$_6$) or molybdenum chloride (MoCl$_5$).

The ALD cycle or other deposition process is controlled to obtain a desired thickness of the metal cap 1220. In some embodiments, the metal deposited in block 1114 has a thickness of about 2 nm, such that the thickness of the entire metal cap 1220 is about 3-4 nm. In various embodiments, the thickness is confined to 3-4 nm to take advantage of gate reduction without impacting RC delay because thicker metal may increase the total gate height and gate capacitance. The first metal cap layer from the first metal cap deposition process serves as a protection layer to avoid metal damage from wet process and to reach the final thickness by the second metal cap deposition process.

Figure 12E:
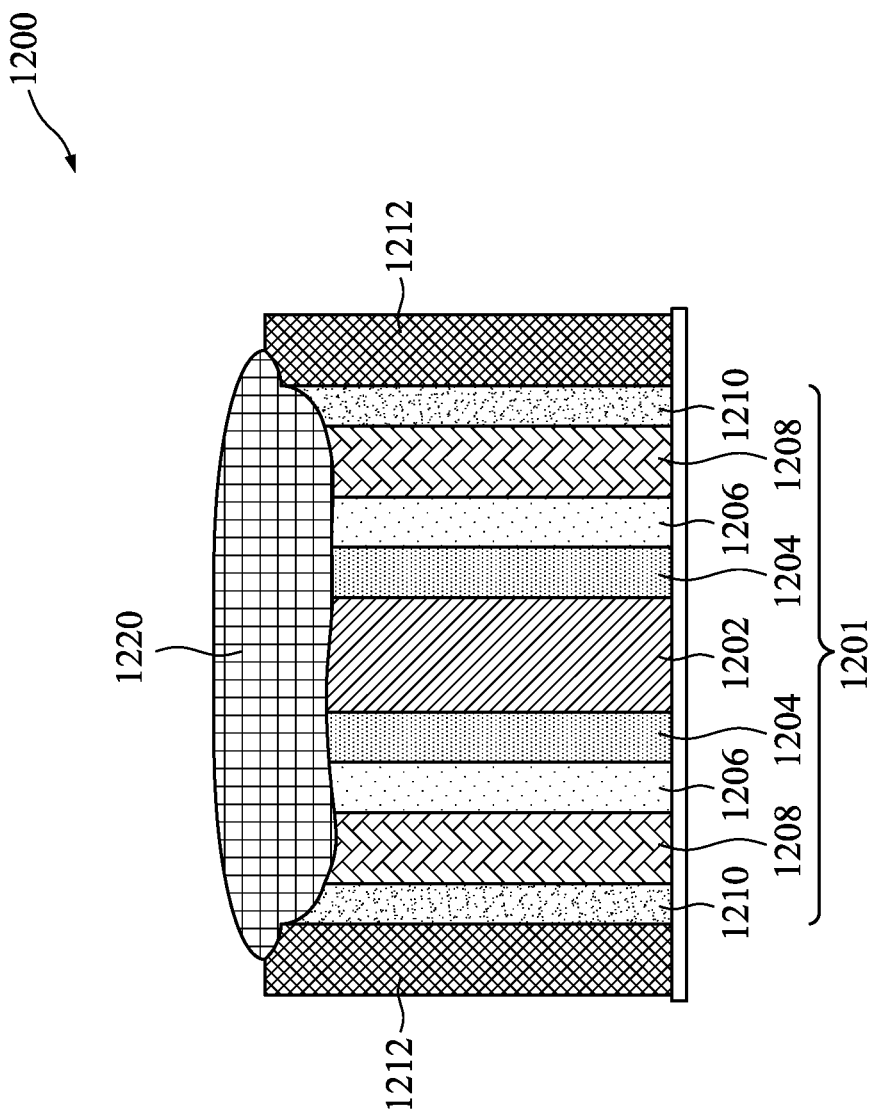
Figure 12F:
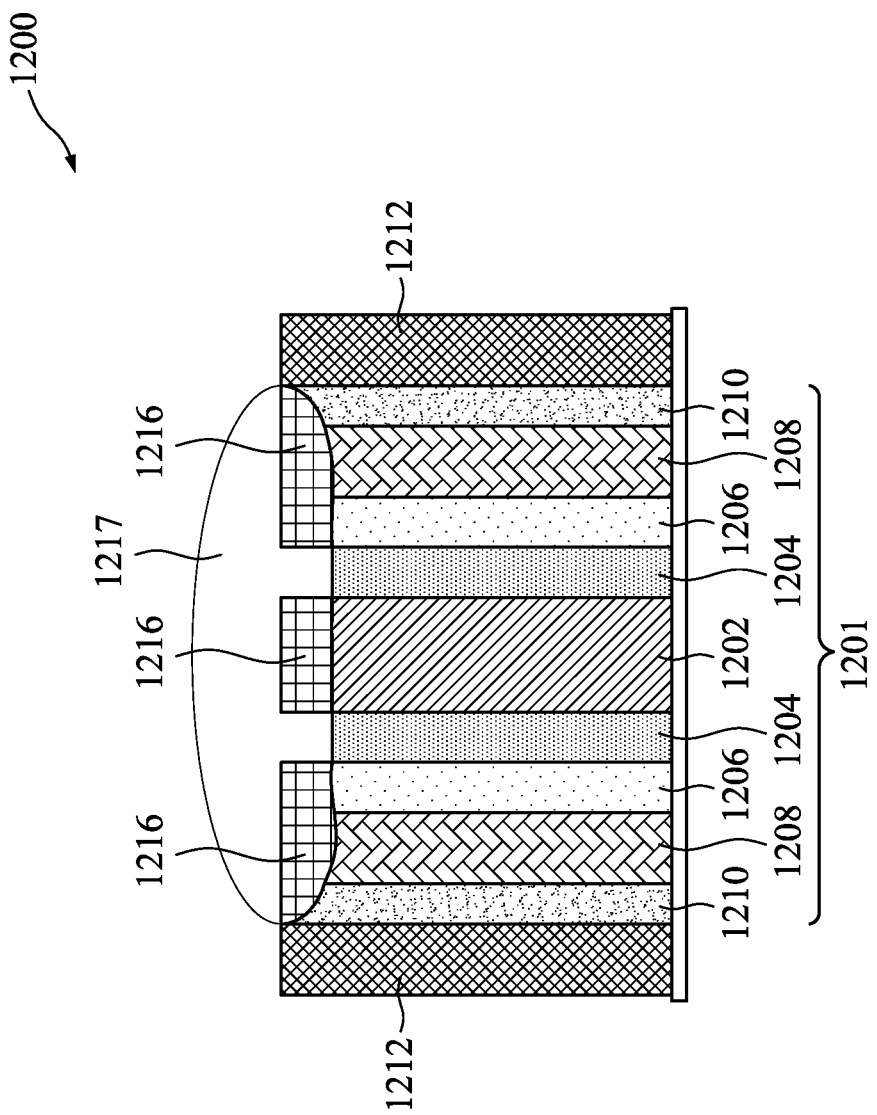

FIG. 12E illustrates the gate structure 1200 after deposition of additional metal material to create a continuous metal cap 1220 in block 1114. In some embodiments, the additional metal material is the same type of metal material as the metal material for the discontinuous metal cap. In some embodiments, the additional metal material 1217 is different from the metal material of the discontinuous metal cap 1216 such that a bilayer metal cap is formed, such as Mo on W or W on Mo as illustrated in FIG. 12F.

At block 1116, lateral growth of the metal cap 1220 is reduced and excess material is removed using a wet chemical process. The metal cap 1220 is confined such that it covers the metal gate stack 1201 but does not cover the side wall spacers 1212. The side wall spacers 1212 may be composed of, for example, silicon, carbide, or nitride. In some embodiments, growth of the metal cap 1220 is confined using an ozone solution, for example, an ozone-deionized water solution (DIO$_3$). Alternatively, hot deionized water (HDI) can be used at a temperature of about 40° C. to about 80° C.

In an embodiment, growth of the metal cap is contained by applying a solution of deionized water and ozone for a time period ranging from about 5 seconds to about 60 seconds. In some embodiments, the solution comprises ozone and hydrochloric acid mixed in water. In an example embodiment, the solution includes DIO$_3$ with a concentration of 5 to 100 ppm at room temperature and HCl with a concentration of 1:1 to approximately 1:50 at a temperature of about 25° C. to about 50° C.

Figure 12G:
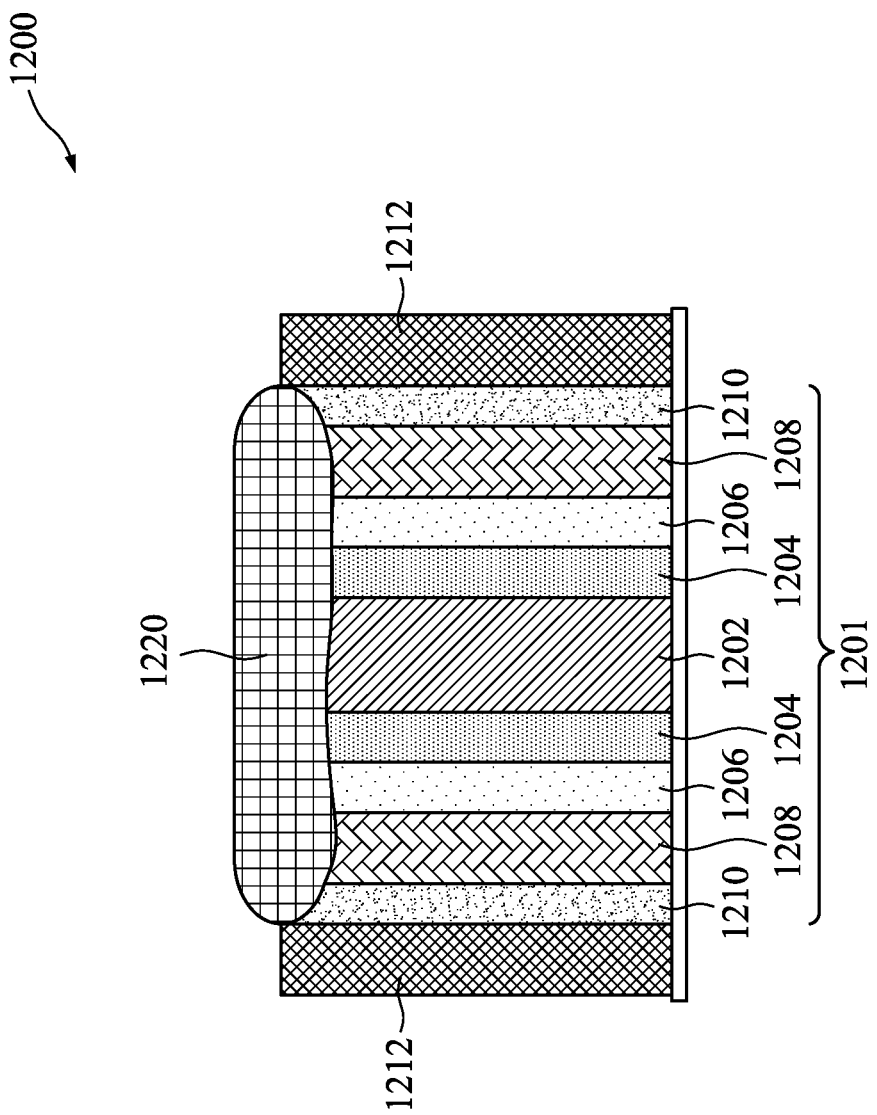

FIG. 12G depicts the gate structure 1200 after lateral growth reduction in block 1116. The continuous metal cap 1220 is now confined so that it is not covering the spacers 1212.

Figure 15:
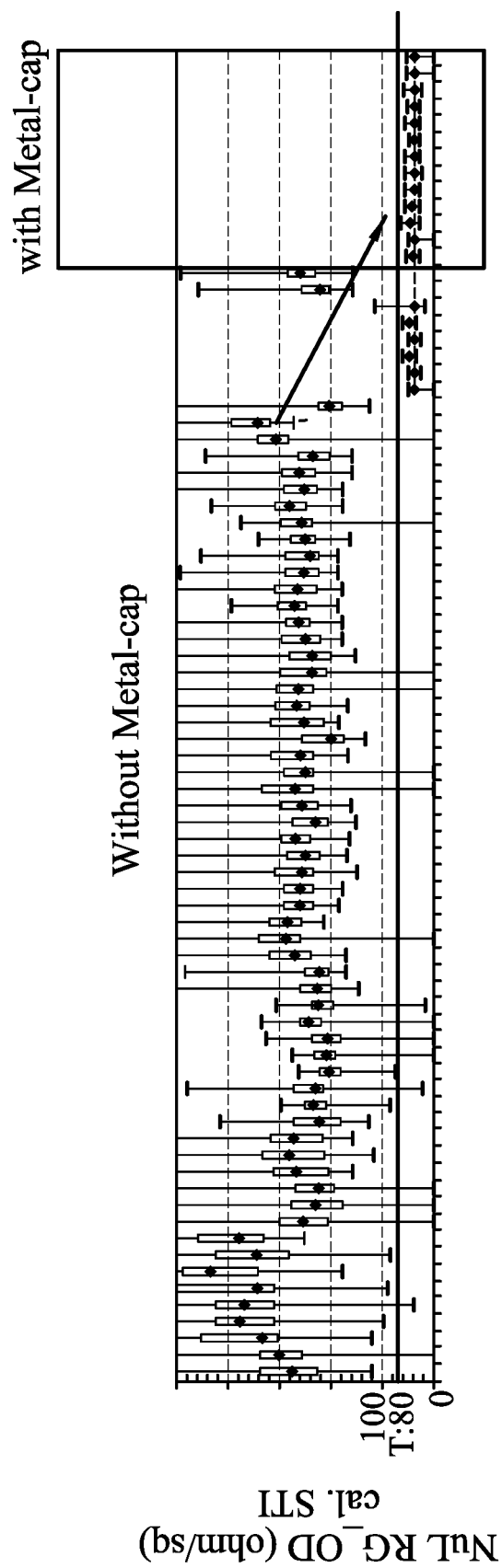
FIG. 15 is a chart illustrating that a decrease in gate resistance can result from the formation of a continuous metal cap over a metal gate structure in a semiconductor device.

One of the benefits of the continuous metal cap 1220 is its ability to reduce gate resistance of the metal gate stack 1201. A decreased gate resistance leads to higher overall performance of a semiconductor device. In an example embodiment, semiconductor devices having the continuous metal cap 1220 had a gate resistance about 80% lower than semiconductor devices without the continuous metal cap 1220. FIG. 15 illustrates the difference in gate resistance that can be achieved for semiconductor devices with a continuous metal cap 1220 versus the gate resistance that may be experienced without a metal cap. In the example of FIG. 15, without the metal cap 1220, the target gate resistance was about 300-400 ohms per square ($\Omega$/sq), measured by four point probe. With the metal cap 1220, the target resistance was lowered to about 80 Ω/sq.

The example method 1100 includes, at block 1118, metal drain fabrication operations to form a metal drain (MD) over the source/drain regions. Metal drain fabrication operations may include removing an exposed portion of an ILD layer to form an opening that exposes an underlying source/drain structure. The exposed portion of the ILD layer can be removed by suitable etching process, such as wet etching, dry etching, or combination thereof. During etching the ILD layer, the etchant is selected to provide etching selectivity between ILD layer and other structures, such as the gate spacers 1212 and the metal cap 1220. For example, the ILD layer has lower etching resistance to the etchant than the gate spacers 1212 and the metal cap 1220, such that the ILD layer can be etched while keeping the gate spacers 1212 and the metal cap 1220 substantially intact.

Metal drain fabrication operations (block 1118) may further include removing the patterned mask and forming a source/drain contact in the opening. Forming a source/drain contact in the opening may include filling a conductive material in the openings contacting the source/drain regions to form a source/drain contact. The source/drain contact may comprise one or more layers. For example, in some embodiments, the source/drain contact comprise a liner and a metal fill material deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact 702 in the opening.

The example method 1100 includes, at block 1120, via gate fabrication operations to form a via gate (VG). Via gate fabrication operations may include forming an opening through interlayer dielectric (ILD) material to contact the metal cap 1220. The opening for the via gate fabrication operations may be formed using acceptable photolithography and etching techniques. The via gate can be deposited by CVD, ALD, electroless deposition (ELD), PVD, electroplating, or another deposition technique.

Figure 12H:
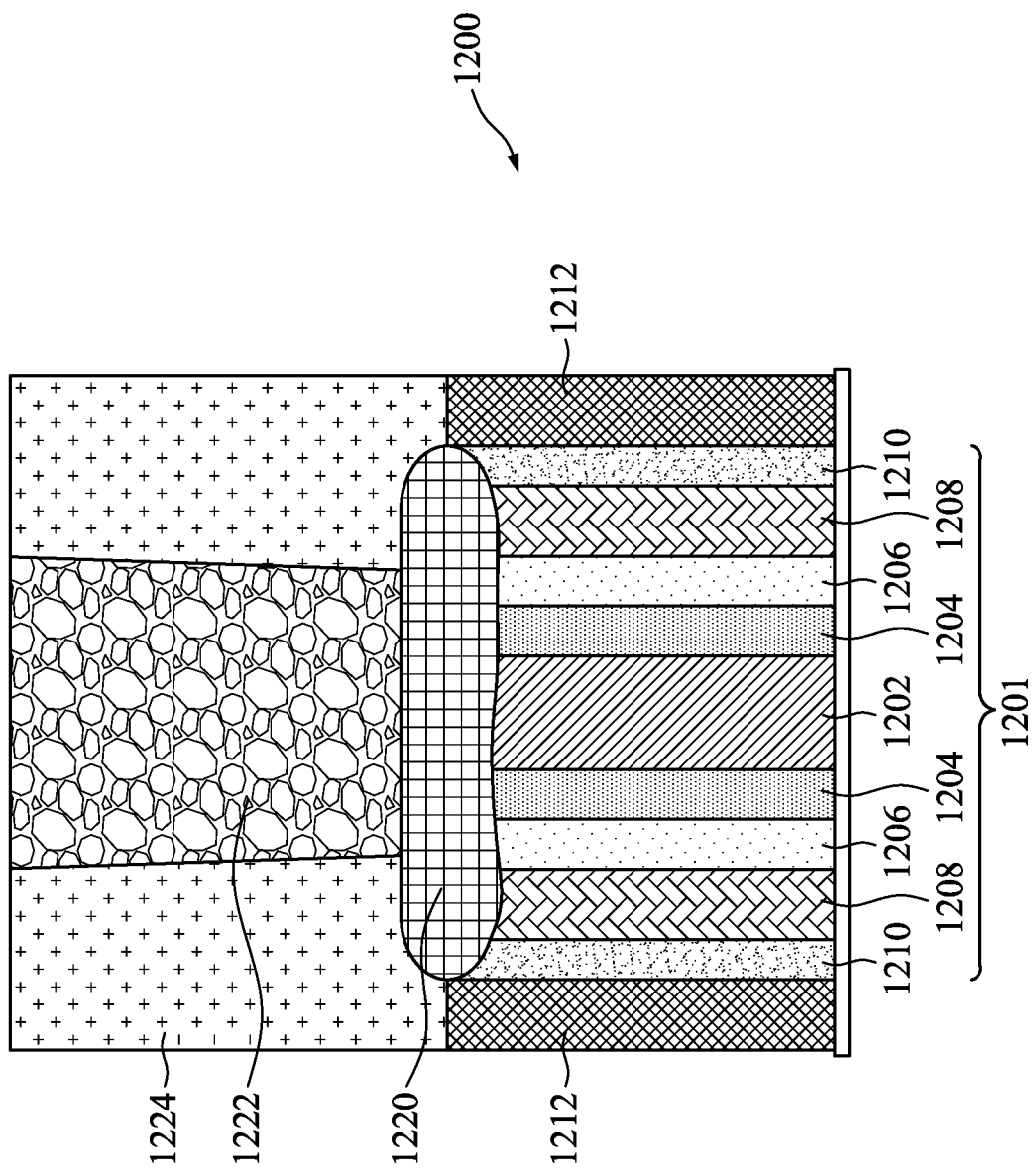

FIG. 12H illustrates the gate structure 1200 after formation of a VG 1222. An MD (not shown) and ILD 1224 have also been formed. The VG 1222 may be or comprise tungsten, cobalt, copper, ruthenium, aluminum, gold, silver, alloys thereof, the like, or a combination thereof. The MD may be copper, a copper alloy, silver, gold, tungsten, cobalt, aluminum, ruthenium, nickel, or the like. The ILD 1224 is a low k material such as an oxide.

The example method 1100 includes, at block 1122, performing further fabrication operations. A semiconductor device may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1100, and some process steps described above may be replaced or eliminated in accordance with various embodiments of the method 1100.

Figure 13:
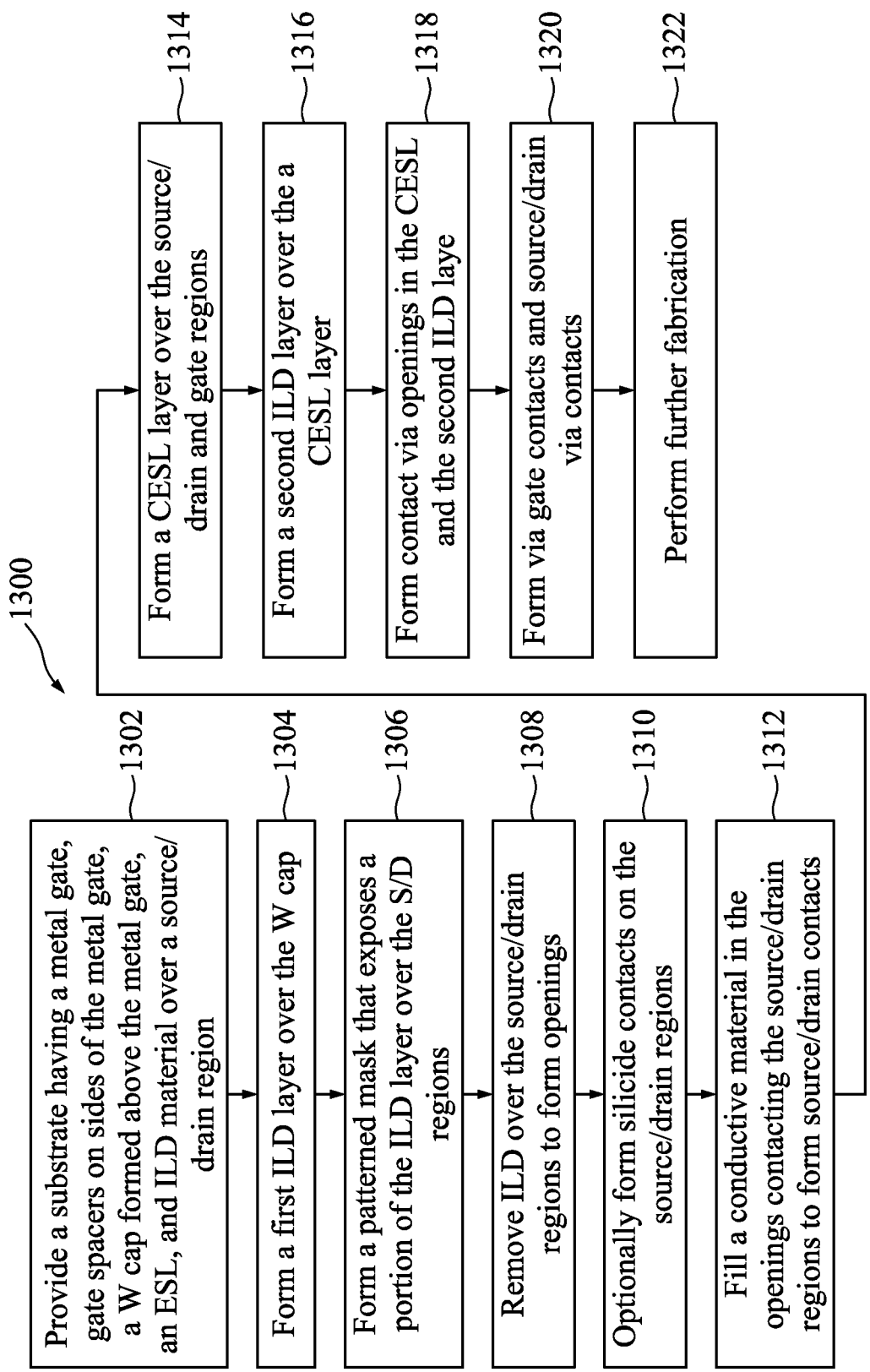
FIG. 13 is a process flow chart depicting an example method of further semiconductor fabrication including metal drain fabrication and via gate fabrication, in accordance with some embodiments.

FIG. 13 is a process flow chart depicting an example method 1300 of semiconductor fabrication that includes metal drain (MD) fabrication and via gate (VG) fabrication, in accordance with some embodiments. The method 1300 is merely an example and is not intended to limit the present disclosure beyond what is explicitly recited in the claims. Additional steps may be provided before, during, and after method 1300, and some of the steps described can be moved, replaced, or eliminated for additional embodiments of method 1300. Additional features may be added in the integrated circuit depicted in the figures, and some of the features described below can be replaced, modified, or eliminated in other embodiments.

FIG. 13 illustrates example operations that may be performed between block 1118 and block 1120 of FIG. 11, in accordance with some embodiments. FIG. 13 is described in conjunction with FIGS. 14A-14E, wherein FIGS. 14A-14E are diagrams depicting expanded views of an example area 1400 at various stages of semiconductor fabricating including metal drain fabrication and via gate fabrication, in accordance with some embodiments. In some figures, some reference numbers of components or features illustrated therein may be omitted to avoid obscuring other components or features; this is for ease of depicting the figures.

At block 1302, the example method 1300 includes providing a substrate having a metal gate, gate spacers on sides of the metal gate, a metal cap formed above the metal gate, an etch stop layer (ESL), and interlayer dielectric (ILD) material over a source/drain region.

At block 1304, the example method 1300 includes forming a first ILD layer over the metal cap. The first ILD layer may include or be a material such as silicon nitride (SiN), although other suitable materials, such as silicon oxide ($SiO_2$), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 1306, the example method 1300 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 14A:
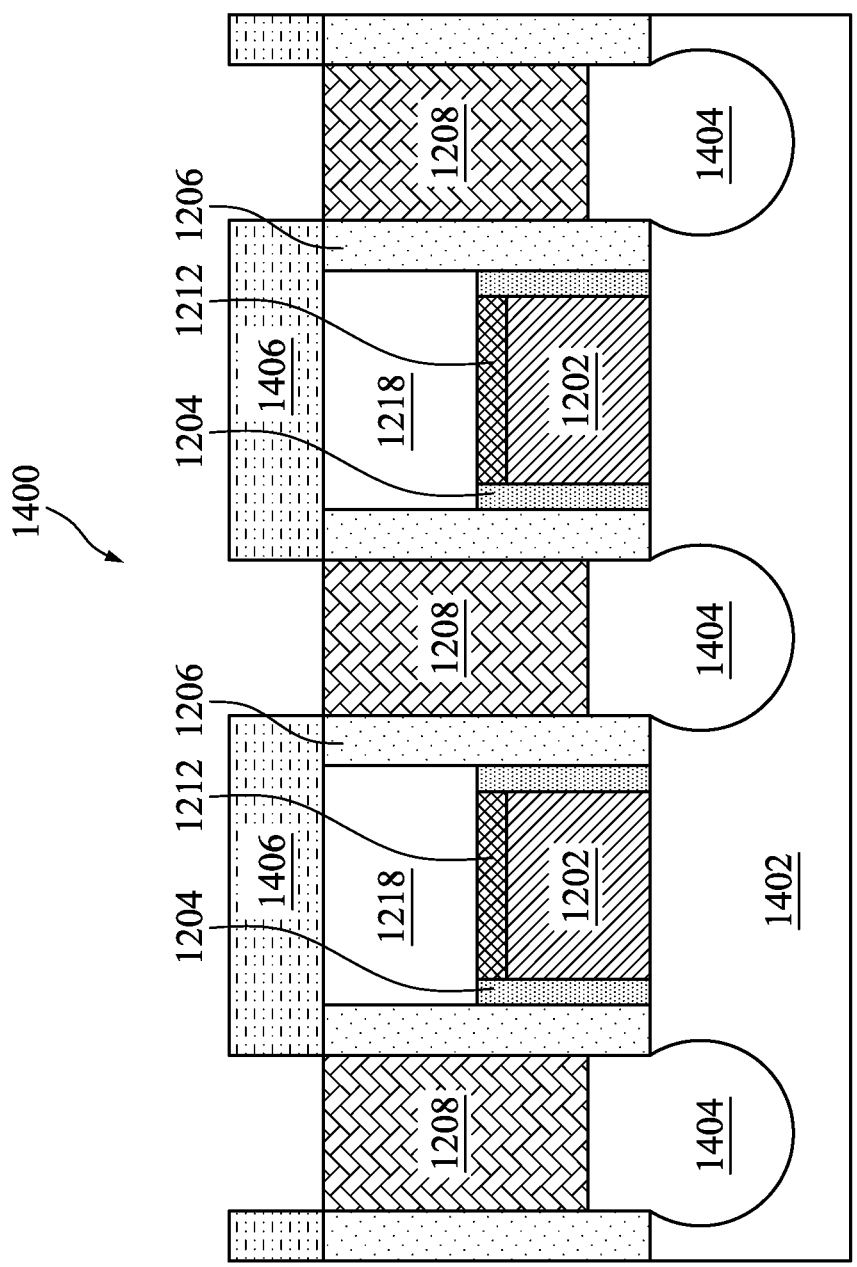
FIGS. 14A-14E are diagrams depicting expanded views of an example area of an example semiconductor device at various stages of semiconductor fabricating including metal drain fabrication and via gate fabrication, in accordance with some embodiments.

Referring to the example of FIG. 14A, in an embodiment after completion of blocks 1302, 1304, and 1306, an area 1400 including a substrate 1402 having a metal gate stack 1201, gate spacers 1212 on sides of the metal gate stack 1201, a metal cap 1220 formed above the metal gate stack 1201, an ESL 1416, ILD material 802 over a source/drain region 1404, a first ILD layer 1414 over the metal cap 1220 and a patterned mask 1406 that exposes a portion of the ILD material 802 over the source/drain regions 1404 is illustrated.

At block 1308, the example method 1300 includes removing ILD material over the source/drain regions to form openings that expose the underlying source/drain regions. The exposed portion of the ILD material can be removed by suitable etching process, such as wet etching, dry etching, or combination thereof.

At block 1310, the example method 1300 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 14B:
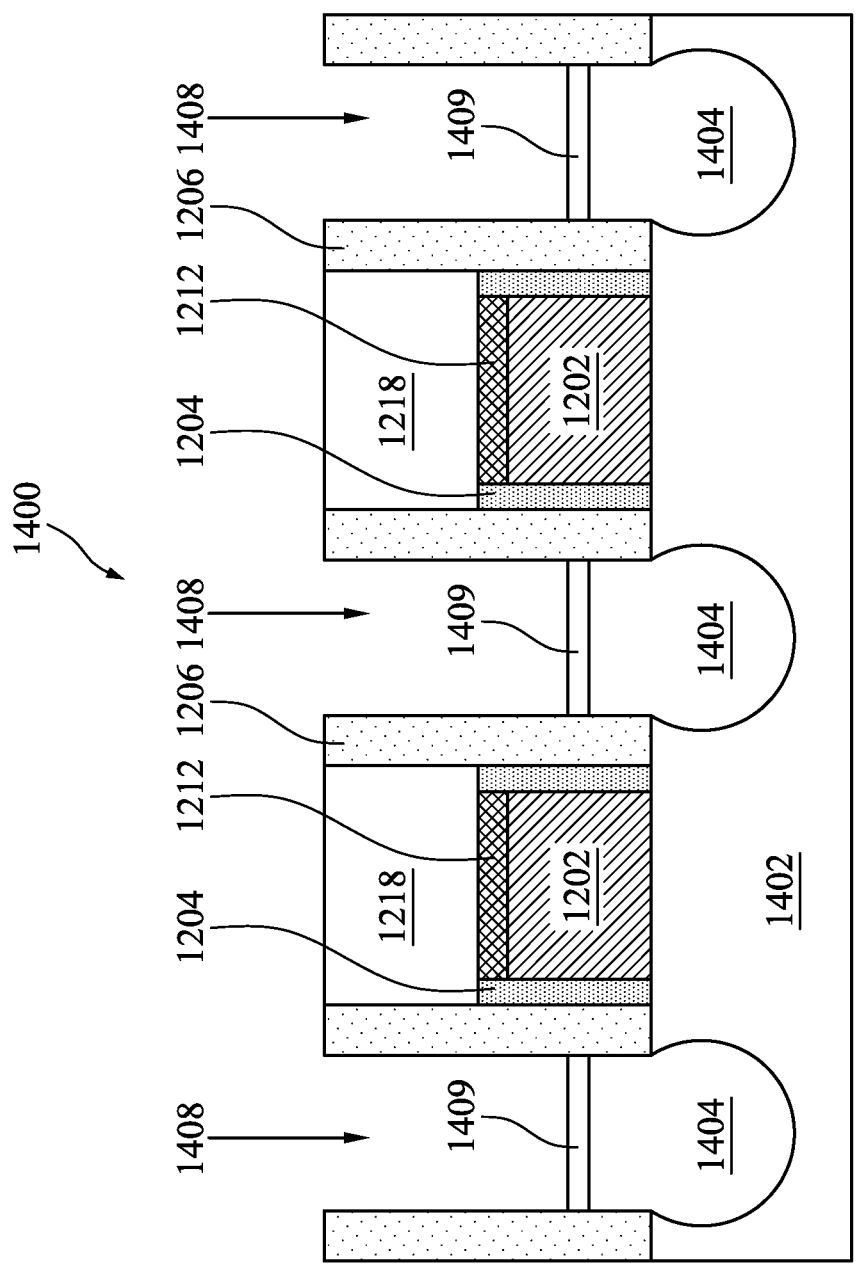

Referring to the example of FIG. 14B, in an embodiment after completion of blocks 1308 and 1310, the area 1400 includes openings 1408 that expose underlying source/drain regions 1404 and optionally formed silicide contacts 1409 on the source/drain regions 1404 that have been exposed. The figure depicts that the ILD material 802 over the source/drain regions 1404 has been removed to form the openings 1408 that expose underlying source/drain regions 1404.

At block 1312, the example method 1300 includes filling a conductive material in the openings contacting the source/drain regions to form source/drain contacts. The source/drain contact 702 may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 14C:
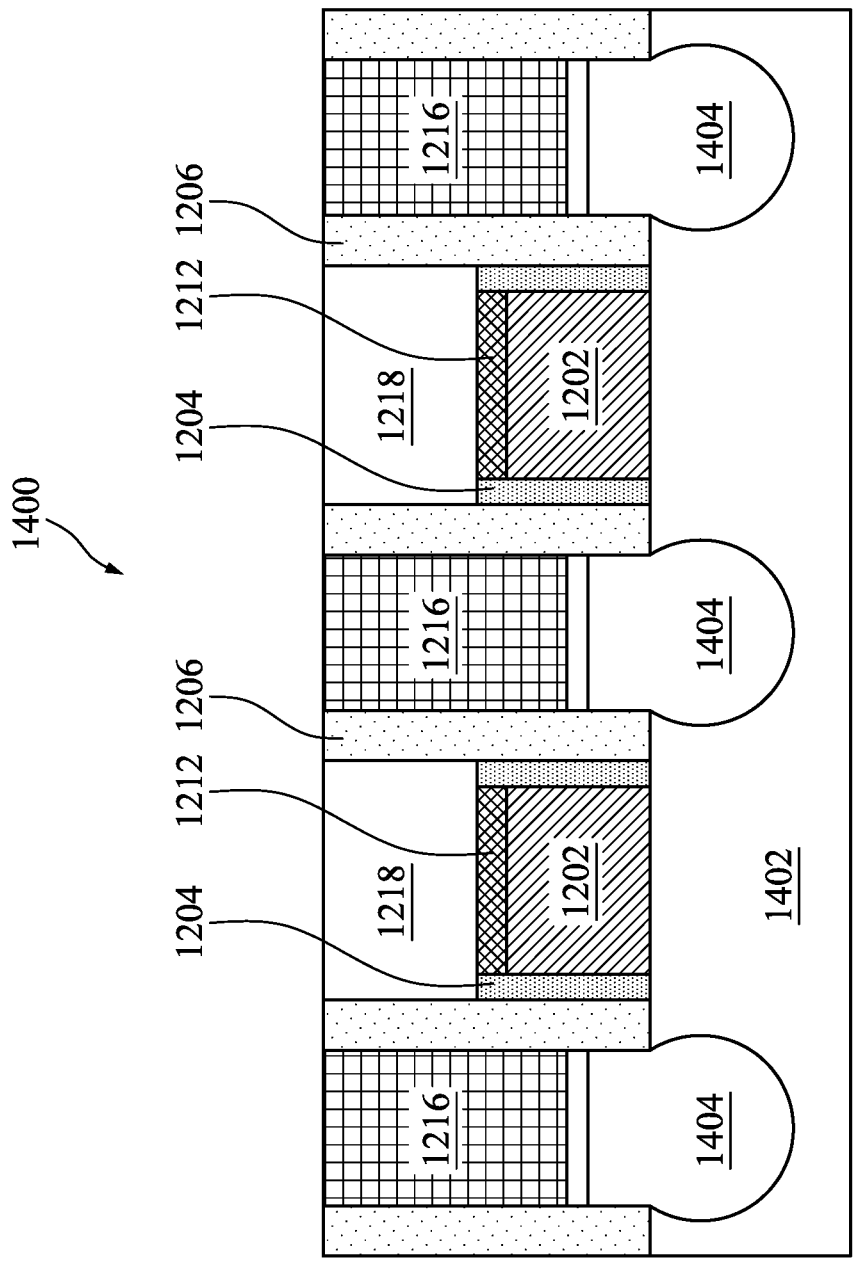

Referring to the example of FIG. 14C, in an embodiment after completion of block 1312, the area 1400 includes a conductive material filling the openings 1408 and contacting the source/drain regions 1404 to form source/drain contacts 702.

At block 1314, the example method 1300 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 1316, the example method 1300 includes forming a second ILD layer over the CESL layer. The second ILD layer may be formed of a dielectric material such as oxides (e.g., silicon oxide ($SiO_2$)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 14D:
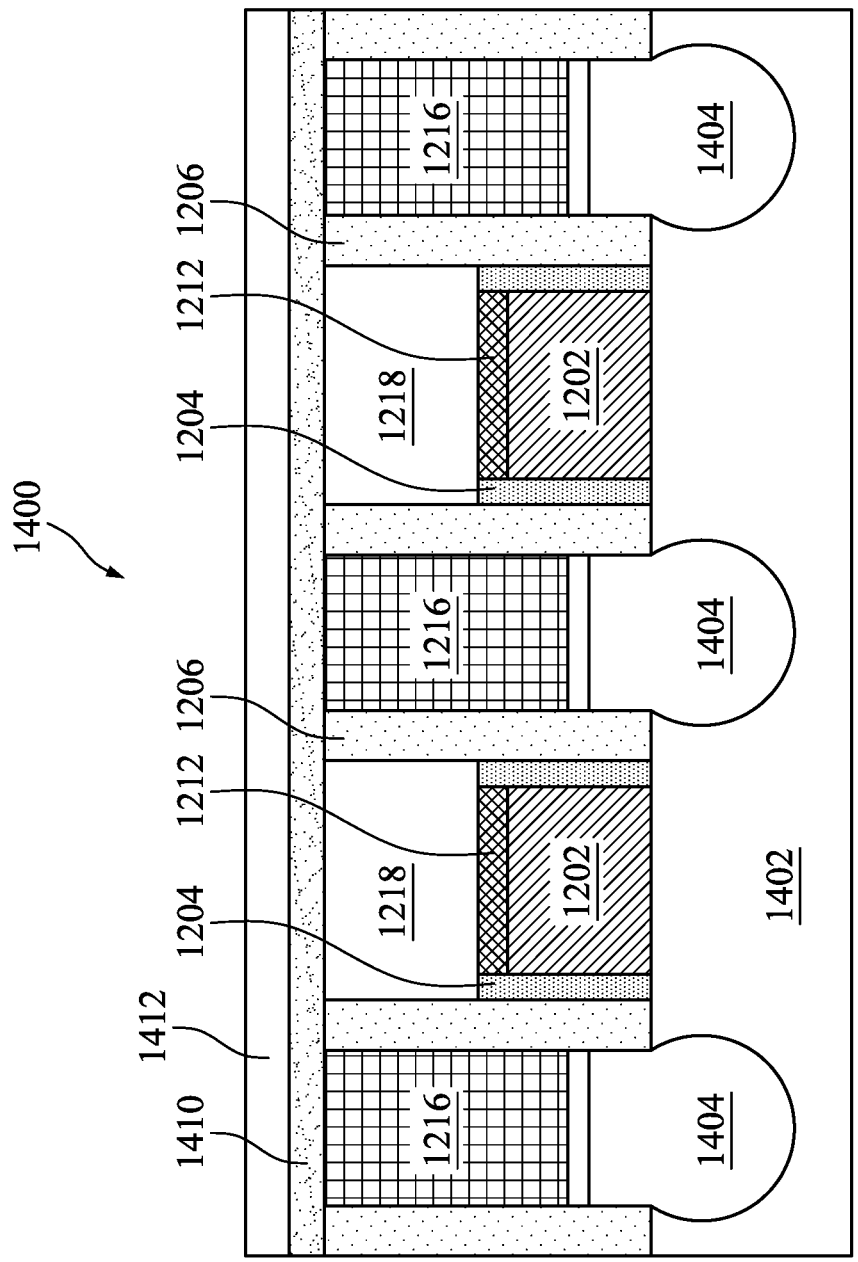

Referring to the example of FIG. 14D, in an embodiment after completion of blocks 1314 and 1316, the area 1400 includes a CESL layer 1410 formed over the source/drain and gate regions and a second ILD layer 1412 formed over the CESL layer 1410.

At block 1318, the example method 1300 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 1320, the example method 1300 includes forming via gate contacts and source/drain via contacts. The gate via contact is formed over and electrically coupled to the metal cap and the source/drain via contact is formed over and electrically coupled to source/drain contacts. The via gate contacts and/or the source/drain via contacts can be formed by depositing metal material in the opening. The metal material may be deposited by CVD, ALD, electroless deposition (ELD), PVD, electroplating, or another deposition technique. The via gate contacts and/or the source/drain via contacts may be or comprise tungsten, cobalt, copper, ruthenium, aluminum, gold, silver, alloys thereof, the like, or a combination thereof.

Figure 14E:
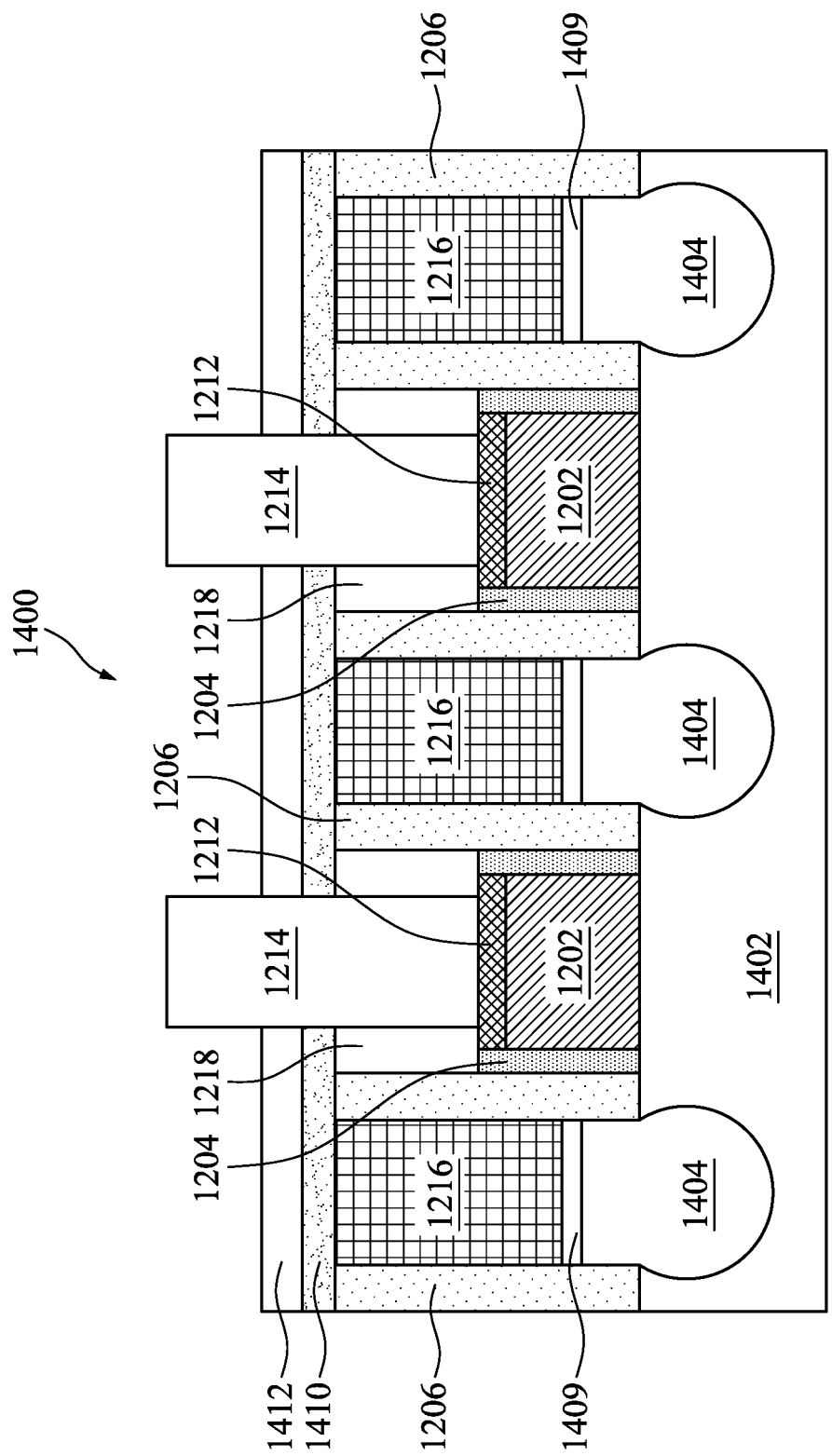

Referring to the example of FIG. 14E, in an embodiment after completion of blocks 1318 and 1320, the area 1400 includes via gate contacts 1222 and source/drain via contacts (not shown).

At block 1322, the example method 1300 includes performing further fabrication operations. A semiconductor device may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1300, and some process steps described above may be replaced or eliminated in accordance with various embodiments of the method 1300.

Improved systems, fabrication methods, fabrication techniques, and articles have been described. The described systems, methods, techniques, and articles can be used with a wide range of semiconductor devices including GAA and FinFET devices.

In various embodiments, a semiconductor device includes a gate structure over a semiconductor substrate and a continuous metal cap over the gat structure. The gate structure includes: a high-k dielectric layer; a p-type work function layer; an n-type work function layer; an anti-reaction layer comprising a dielectric material; and a glue layer. The continuous metal cap was formed by: metal material being deposited over the gate structure which formed a discontinuous metal cap in first deposition operations; a portion of the anti-reaction layer being selectively removed using first wet chemical operations; additional metal material being deposited over the gate structure to create the continuous metal cap in second deposition operations; and growth of the metal cap being contained using second wet chemical operations.

In certain embodiments of the semiconductor device, the continuous metal cap includes tungsten (W) material or molybdenum (Mo) material.

In certain embodiments of the semiconductor device, the gate structure was prepared for the continuous metal cap to be formed over the gate structure. The gate structure was prepared by: a top layer of the gate structure being flattened using planarization operations; a surface of the gate structure being precleaned using a deionized (DI) water rinse; and the surface of the gate structure being pretreated using an oxidation or nitridation treatment.

In certain embodiments of the semiconductor device, the portion of the anti-reaction layer was selectively removed using dilute hydrofluoric acid (HF) or an etching solution that includes ammonium hydroxide ($NH_4OH$), hydrogen peroxide ($H_2O_2$), and water ($H_2O$).

In certain embodiments of the semiconductor device, the anti-reaction layer includes a silicon-containing material.

In certain embodiments of the semiconductor device, the gate structure has a gate resistance (Rg) of less than or equal to 80 ohms per square ($\Omega$/sq).

In various embodiments, a method of forming a continuous metal cap over a metal gate structure includes: receiving a gate structure having a high-k dielectric layer, a p-type work function layer, an n-type work function layer, an anti-reaction layer that includes a dielectric material, and a glue layer. The method further includes pretreating the surface of the gate structure using an oxidation or nitridation treatment; depositing metal material over the gate structure which forms a discontinuous metal cap using first deposition operations; selectively removing a portion of the anti-reaction layer using first wet chemical operations; depositing additional metal material over the gate structure to create the continuous metal cap using second deposition operations; and containing growth of the metal cap using second wet chemical operations.

In certain embodiments the method further includes forming a via gate (VG) on the metal cap. The forming a VG includes: forming an opening through interlayer dielectric (ILD) material to contact the metal cap using etching operations; and depositing metal material in the opening using deposition operations.

In certain embodiments of the method, the first and second deposition operations include atomic layer deposition (ALD) operations, and the metal cap includes tungsten (W) deposited by tungsten chloride ($WCl_5$) and hydrogen ($H_2$) gas.

The method of claim 10, wherein the first and second ALD operations comprise atomic layer deposition (ALD) operations, and wherein the metal cap comprises tungsten (W) deposited by tungsten fluoride ($WF_6$) and $H_2$ gas.

The method of claim 10, wherein the first and second deposition operations comprise atomic layer deposition (ALD) operations, and wherein the metal cap comprises molybdenum (Mo) deposited by molybdenum chloride ($MoCl_5$) and $H_2$ gas.

In certain embodiments of the method, the first wet chemical operations used to remove the anti-reaction layer includes rinsing with dilute hydrofluoric acid (HF).

In certain embodiments of the method, the first wet chemical operations used to remove the portion of the anti-reaction layer includes rinsing with an etching solution that includes ammonium hydroxide ($NH_4OH$), hydrogen peroxide ($H_2O_2$), and water ($H_2O$).

In certain embodiments of the method, the second wet chemical operations used to contain the growth of the metal cap includes a wet etching operation using an ozone solution.

In another embodiment, a fabrication method includes: receiving a gate structure having a high-k dielectric layer, a p-type work function layer, an n-type work function layer, a dielectric anti-reaction layer, and a glue layer. The method further includes: pretreating the surface of the gate structure using an oxygen ($O_2$) or hydrogen/nitrogen ($H_2/N_2$) plasma treatment; depositing a first metal material comprising tungsten (W) material or molybdenum (Mo) material over the gate structure which forms a discontinuous metal cap using first atomic layer deposition (ALD) operations; selectively removing a portion of the anti-reaction layer using dilute hydrofluoric acid (HF); depositing second metal material comprising W or Mo over the gate structure to create a continuous metal cap using second ALD operations; containing growth of the metal cap by removing unwanted metal material from side spacers via wet etching operations using an ozone solution; and forming a via gate (VG) on the metal cap. Forming the VG on the metal cap includes forming an opening through interlayer dielectric (ILD) material to contact the metal cap using etching operations and depositing metal material in the opening using deposition operations.

In certain embodiments of the fabrication method, the first and second ALD operations include depositing W by tungsten chloride ($WCl_5$) and hydrogen ($H_2$) gas.

In certain embodiments of the fabrication method, the first and second ALD operations comprise depositing W by tungsten fluoride ($WF_6$) and $H_2$ gas.

In certain embodiments of the fabrication method, the first and second ALD operations comprise depositing Mo by molybdenum chloride ($MoCl_5$) and $H_2$ gas.

In certain embodiments of the fabrication method, one of the first metal material and second metal material comprises W and the other of the first metal material and second metal material comprises Mo.

In certain embodiments of the fabrication method, the method further comprises flattening a top layer of the gate structure using chemical mechanical polishing (CMP) operations and precleaning a surface of the gate structure using a deionized (DI) water rinse prior to pretreating the surface of the gate structure.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming a continuous metal cap over a metal gate structure, comprising:
   receiving a gate structure comprising:
      a high-k dielectric layer;
      one or more of a p-type work function layer or an n-type work function layer;
      an anti-reaction layer comprising a dielectric material; and
      a glue layer;
   pretreating a top surface of the gate structure using an oxidation or nitridation treatment;
   depositing metal material over the gate structure which forms a discontinuous metal cap using first deposition operations;
   selectively removing a portion of the anti-reaction layer using first wet chemical operations;
   depositing additional metal material over the gate structure to create the continuous metal cap using second deposition operations; and
   containing growth of the continuous metal cap using second wet chemical operations.

2. The method of claim 1, wherein the first and second deposition operations comprise atomic layer deposition (ALD) operations, and wherein the continuous metal cap comprises tungsten (W) deposited by tungsten chloride ($WCl_5$) and hydrogen ($H_2$) gas.

3. The method of claim 1, wherein the first and second deposition operations comprise atomic layer deposition (ALD) operations, and wherein the continuous metal cap comprises tungsten (W) deposited by tungsten fluoride ($WF_6$) and $H_2$ gas.

4. The method of claim 1, wherein the first and second deposition operations comprise atomic layer deposition (ALD) operations, and wherein the continuous metal cap comprises molybdenum (Mo) deposited by molybdenum chloride ($MoCl_5$) and $H_2$ gas.

5. The method of claim 1, wherein the first wet chemical operations used to remove the anti-reaction layer comprises rinsing with dilute hydrofluoric acid (HF).

6. The method of claim 1, wherein the first wet chemical operations used to remove the portion of the anti-reaction layer comprises rinsing with an etching solution comprising ammonium hydroxide ($NH_4OH$), hydrogen peroxide ($H_2O_2$), and water ($H_2O$).

7. The method of claim 1, wherein the second wet chemical operations used to contain the growth of the continuous metal cap comprises a wet etching operation using an ozone solution.

8. A method, comprising:
   receiving a gate structure comprising:
      a high-k dielectric layer;
      one or more of a p-type work function layer or an n-type work function layer;
      an anti-reaction layer comprising a dielectric material; and
      a glue layer;
   pretreating a top surface of the gate structure using an oxygen ($O_2$) or hydrogen/nitrogen ($H_2/N_2$) plasma treatment;
   depositing a first metal material comprising tungsten (W) material or molybdenum (Mo) material over the gate structure which forms a discontinuous metal cap using first atomic layer deposition (ALD) operations;
   selectively removing a portion of the anti-reaction layer using dilute hydrofluoric acid (HF);
   depositing second metal material comprising W or Mo over the gate structure to create a continuous metal cap using second ALD operations; and
   containing growth of the continuous metal cap by removing unwanted metal material from side spacers via wet etching operations using an ozone solution.

9. The method of claim 8, wherein the first and second ALD operations comprise depositing W by tungsten chloride ($WCl_5$) and hydrogen ($H_2$) gas.

10. The method of claim 8, wherein the first and second ALD operations comprise depositing W by tungsten fluoride ($WF_6$) and $H_2$ gas.

11. The method of claim 8, wherein the first and second ALD operations comprise depositing Mo by molybdenum chloride ($MoCl_5$) and $H_2$ gas.

12. The method of claim 8, wherein one of the first metal material and second metal material comprises W and another of the first metal material and second metal material comprises Mo.

13. The method of claim 8, further comprising flattening a top layer of the gate structure using chemical mechanical polishing (CMP) operations and precleaning a surface of the gate structure using a deionized (DI) water rinse prior to pretreating the surface of the gate structure.

14. A method, comprising:
   providing a metal gate (MG) stack comprising:
      a high-k dielectric layer;
      one or more of a p-type work function layer or an n-type work function layer;
      an anti-reaction layer comprising a dielectric material; and
      a glue layer;
   forming a recess in the high-k dielectric layer, the one or more of the p-type work function layer or the n-type work function layer, and the glue layer;
   depositing a first metal material over: the MG stack in the recess in the high-k dielectric layer, the one or more of the p-type work function layer or the n-type work function layer, and the glue layer;
   forming a recess in the anti-reaction layer;
   depositing a second metal material over the MG stack to create a continuous metal cap; and
   reducing lateral growth of the continuous metal cap via wet etching operations using an ozone solution.

15. The method of claim 14, wherein the anti-reaction layer comprises a silicon-containing material.

16. The method of claim 14, wherein a gate structure comprising the MG stack and the continuous metal cap has a gate resistance ($R_g$) of less than or equal to 80 ohms per square ($\Omega/sq$).

17. The method of claim 14, further comprising pretreating a top surface of the MG stack using an oxygen ($O_2$) or hydrogen/nitrogen (H$_2$/N$_2$) plasma treatment prior to forming the recess in the high-k dielectric layer.

18. The method of claim 17, further comprising precleaning the top surface of the MG stack using a deionized (DI) water rinse prior to pretreating the top surface of the MG stack.

19. The method of claim 14, wherein one of the first metal material and the second metal material comprises W and another of the first metal material and the second metal material comprises Mo.

20. The method of claim 14, wherein both of the first metal material and the second metal material comprises W or both of the first metal material and the second metal material comprises Mo.

* * * * *